United States Patent
Mak et al.

(10) Patent No.: US 7,373,572 B2
(45) Date of Patent: *May 13, 2008

(54) SYSTEM PULSE LATCH AND SHADOW PULSE LATCH COUPLED TO OUTPUT JOINING CIRCUIT

(75) Inventors: Tak M. Mak, Union City, CA (US);
Ming Zhang, Urbana, IL (US);
Subhasish Mitra, Folsom, CA (US);
Paul E. Shipley, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 408 days.

This patent is subject to a terminal disclaimer.

(21) Appl. No.: 11/128,692

(22) Filed: May 12, 2005

(65) Prior Publication Data

US 2006/0168487 A1    Jul. 27, 2006

(51) Int. Cl.
*G01R 31/28* (2006.01)

(52) U.S. Cl. .............. 714/729; 714/724; 714/799; 714/819; 714/6; 327/202; 377/70

(58) Field of Classification Search ............. None
See application file for complete search history.

(56) References Cited

U.S. PATENT DOCUMENTS

| | | | |
|---|---|---|---|
| 5,742,190 A | 4/1998 | Banik et al. | |
| 5,742,192 A * | 4/1998 | Banik | 327/166 |
| 6,320,418 B1 * | 11/2001 | Fujii et al. | 326/93 |
| 6,326,829 B1 * | 12/2001 | Naffziger | 327/227 |
| 6,944,784 B2 * | 9/2005 | Clark et al. | 713/600 |
| 7,162,661 B2 * | 1/2007 | Mudge et al. | 714/10 |
| 2003/0233622 A1 * | 12/2003 | Nystrom et al. | 716/1 |
| 2005/0207521 A1 * | 9/2005 | Lee et al. | 375/355 |
| 2006/0114029 A1 * | 6/2006 | Anderson et al. | 326/95 |
| 2007/0016823 A1 * | 1/2007 | Jang et al. | 714/6 |

OTHER PUBLICATIONS

Seifert et al., "Radiation-Induced Clock Jitter and Race," Proceedings of the International Physics Reliability Symposium, IPRS, San Jose, CA, pp. 215-222, Apr. 2005.

* cited by examiner

*Primary Examiner*—John P Trimmings
(74) *Attorney, Agent, or Firm*—Schwabe, Williamson & Wyatt, P.C.

(57) ABSTRACT

In one embodiment, an apparatus includes a system pulse latch to generate at least one system latch signal in response to a data input signal and a pulsed system clock signal; a shadow pulse latch to generate at least one shadow latch signal in response to the data input signal and the pulsed system clock signal; and an output joining circuit, coupled to the system pulse latch and the shadow pulse latch, to provide a data output signal in response to the at least one system latch signal and the at least one shadow latch signal.

24 Claims, 16 Drawing Sheets

| O1 | O2 | Q |
|---|---|---|
| 0 | 0 | 0 |
| 1 | 1 | 1 |
| 0 | 1 | PREVIOUS VALUE RETAINED |
| 1 | 0 | PREVIOUS VALUE RETAINED |

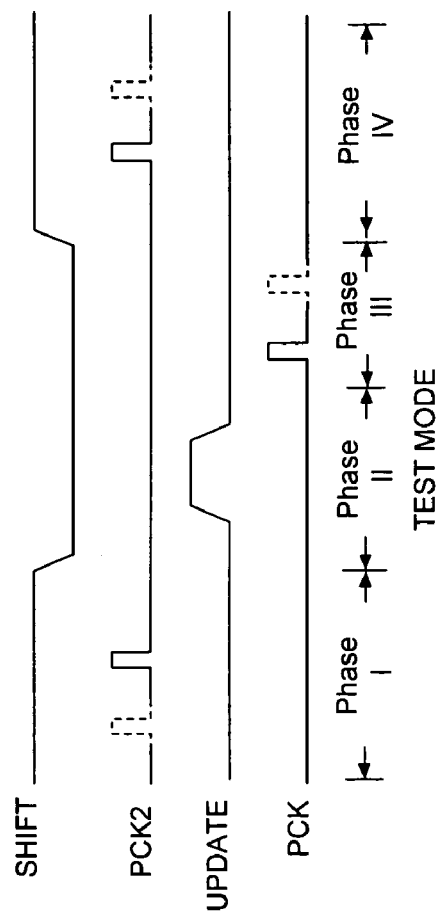
FIG. 13 TEST MODE
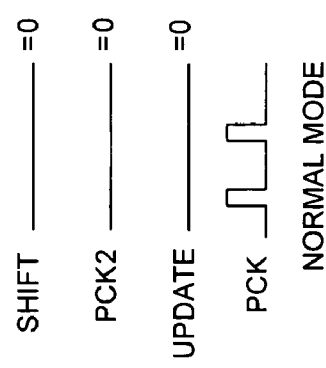
FIG. 14 NORMAL MODE

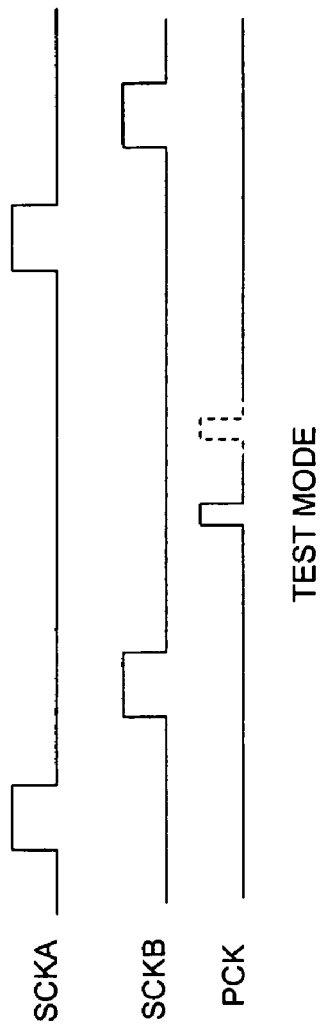
FIG. 18 TEST MODE
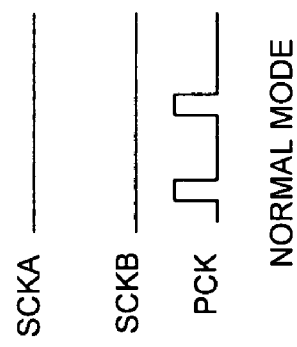
FIG. 19 NORMAL MODE

SYSTEM PULSE LATCH AND SHADOW PULSE LATCH COUPLED TO OUTPUT JOINING CIRCUIT

BACKGROUND

1. Technical Field

Embodiments of the present invention are related to the field of electronic devices, and in particular, to error reduction in electronic devices.

2. Description of Related Art

Single event upsets (SEUs), also referred to as soft errors (SERs), are radiation-induced transient errors in digital systems caused by high energy particles such as neutrons generated from cosmic rays and alpha particles from packaging material. Soft errors may be significant for microprocessors, network processors, high end routers and network storage components that target enterprise and applications with very high reliability, data integrity and availability. Bistables (latches and flip-flops) may be major contributors to the system-level soft error rate.

Scan Design-For-Testability (DFT) has become a de facto test standard in the industry because it enables an automated solution to high quality production testing at low cost. In addition, scan DFT may be used for post-silicon debug activities because it provides access to the internal nodes of an integrated circuit. Scan implementations in major high-end microprocessors involve significant circuitry and clock signals that are used only during post-silicon debug and production testing.

Referring to FIG. 1, a conventional pulse latch/scan cell 10 is shown for use in scan DFT. The latch/scan cell 10 includes a system pulse latch 12 and a scan circuit 14. The system pulse latch 12 is a single phase latch which stores (latches) a data input signal D based upon a clock pulse of a pulsed system clock signal PCK and generates a data output signal Q. The data input signal D enters the system pulse latch 12 during a brief transparency window defined by the rising and falling edges of the pulsed system clock signal PCK and is stored in the pulse latch 12 for the rest of the clock cycle. In an integrated circuit (IC), pulse latch/scan cells 10 are positioned at input and output nodes of combinational logic circuits.

The pulse latch/scan cell 10 has a test and a functional mode of operation. During the test mode, the scan circuits 14 are chained together to form a serial shift register (not shown). With respect to a given cell 10 at an input node of a combinational logic circuit (not shown), a signal SHIFT may be applied to a tri-state enable inverter 16 to allow a scan-in (SI) signal (test pattern) to be stored in a storage element (inverters 17 and 18) of the pulse latch 12 and applied via the output terminal Q to the downstream combinational logic circuit. Another cell 10 at an output node of the combinational logic circuit, in response to the pulsed system clock signal PCK, captures a system response to the test pattern on the input terminal for the data input signal D. The captured system response may be placed on the output terminal SO (becomes a scan-out signal) in response to applying the signal SHIFT to a second tri-state enable buffer 19. During the functional mode of operation, the signal SHIFT is in a low state; hence, the inverter 16 is turned off so that the scan-in signal SI does not disturb the normal latch operation. Therefore, the scan circuit 14 is essentially not used, although it occupies additional area and draw additional leakage power.

BRIEF DESCRIPTION OF THE DRAWINGS

FIG. 13 is a timing diagram for the hardening/scan cell of FIG. 9 during a test mode of operation, according to one embodiment of the present invention.

FIG. 14 is a timing diagram for the hardening/scan cell of FIG. 9 during a functional mode of operation, according to one embodiment of the present invention.

FIG. 18 is a timing diagram for the hardening/scan cell of FIG. 16 during a test mode of operation, according to one embodiment of the present invention.

FIG. 19 is a timing diagram for the hardening/scan cell of FIG. 16 during a functional mode of operation, according to one embodiment of the present invention.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Various embodiments according to the present invention are directed toward protecting pulse latches in an IC chip from soft errors by enabling the pulse latches with built-in resilience (hardening) to soft errors. In a first embodiment according to the present invention, duplication of a system pulse latch to provide a shadow pulse latch (creating two parallel pulse latches) is undertaken for the purpose of providing hardening to soft errors. In this embodiment, the shadow pulse latch is not used for a DFT scan purpose. In a "reuse" group of embodiments according to the present invention, redundant pulse latches already may be included in an IC design for the DFT scan purpose; hence, the already-duplicated pulse latches also may be used for hardening to soft errors. Without this additional use for hardening to errors, the shadow pulse latch just for the DFT scan purpose would not be used during normal (functional) operation. Hence, this group of embodiments incorporates a "reuse" concept for already-existing dual pulse latches. In all the embodiments, soft error resilience may be achieved by coupling an output joining circuit, such as a C-element circuit, to the outputs of the two pulse latches.

Figure 1:
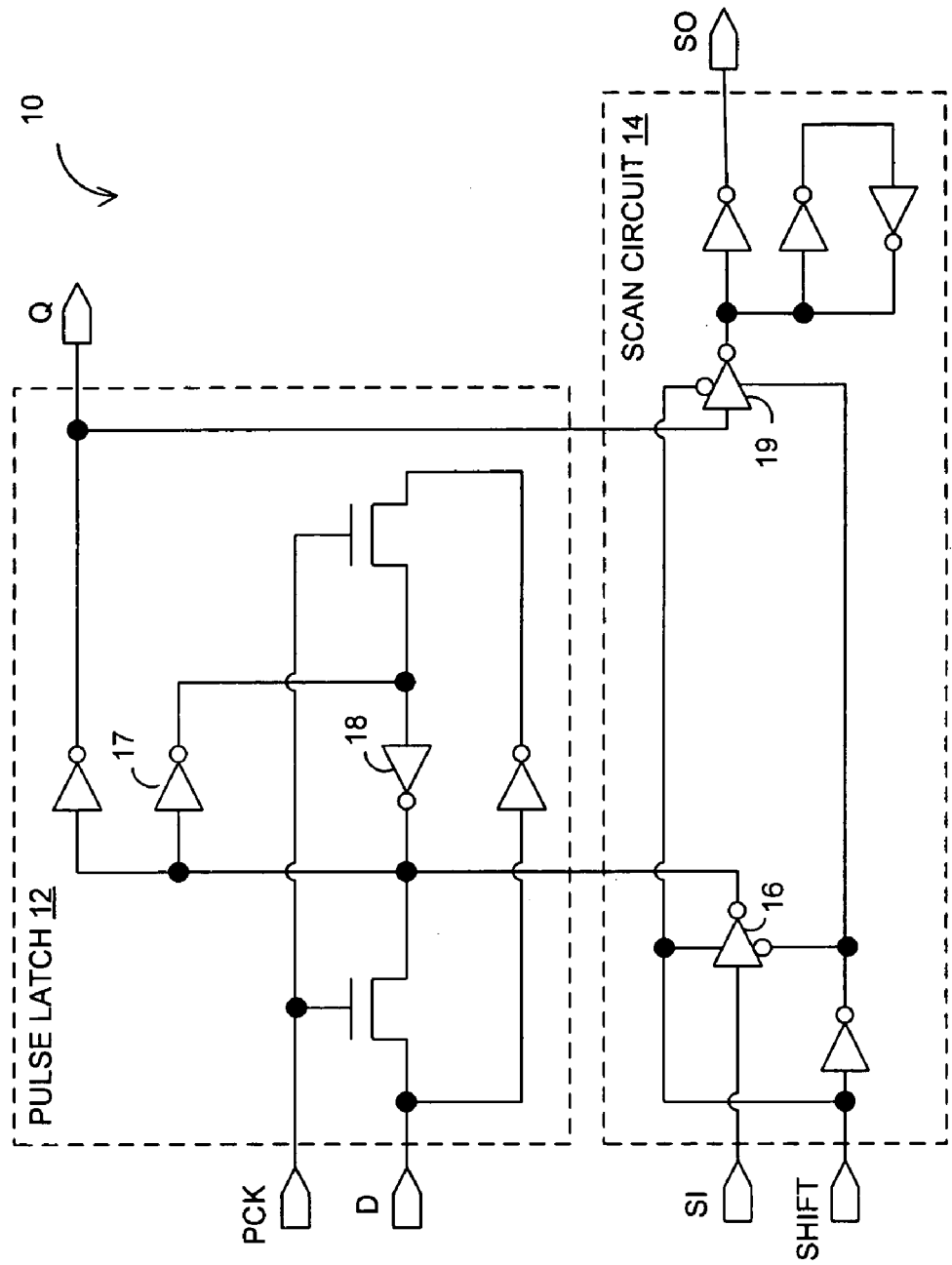
FIG. 1 is a circuit schematic of a conventional non-hold system latch/scan cell.
Figure 2:
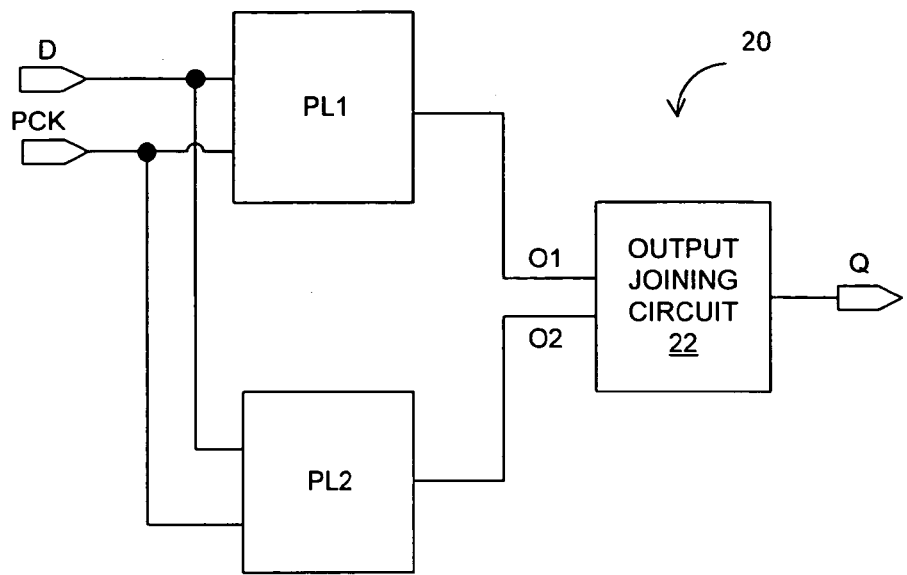
FIG. 2 is a block diagram of a latch hardening cell, according to one embodiment of the present invention.

Referring to FIG. 2, a latch hardening cell 20 may include dual pulse latches: a system pulse latch PL1 and a shadow pulse latch PL2, according to one embodiment of the present invention. In one embodiment, a data input signal D may be commonly coupled to data input terminals of the pulse latches PL1 and PL2. Likewise, a pulsed system clock signal PCK may be commonly coupled to clock input terminals of the pulse latches PL1 and PL2. The pulse latches PL1 and PL2 may use pulse clocking, wherein the pulsed system clock signal PCK is a pulsed clock with a duty cycle substantially less than 50%. The pulsed system clock signal PCK may be generated from a pulse generator (not shown). The pulsed system clock signal PCK may be continuously applied so that the data input signal may move into and out of the pulse latches PL1 and PL2 simultaneously.

Figure 3:
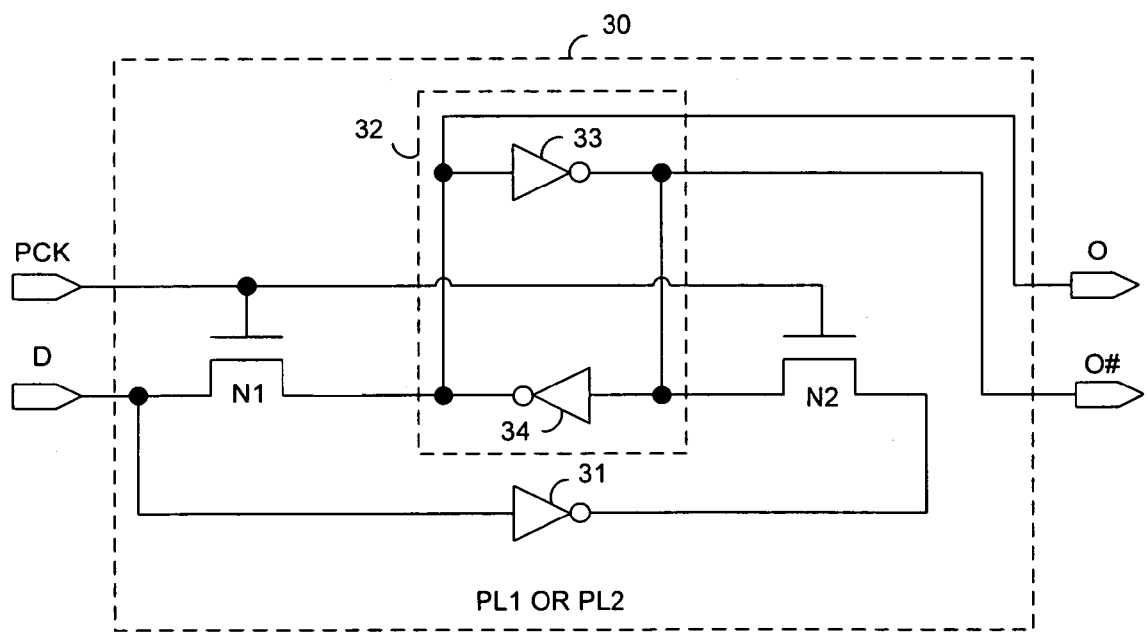
FIG. 3 is a circuit schematic of a pulse latch which may be used in the latch hardening cell of FIG. 1, according to one embodiment of the present invention.

In one embodiment, a system latch signal O1 and a shadow latch signal O2 may be generated by the system and shadow pulse latches PL1 and PL2, respectively, and may be provided as inputs to an output joining circuit 22. The output joining circuit 22 may provide a data output signal Q with resilience (hardening) against soft errors. As will be discussed hereinafter, one design for both of the pulse latches PL1 and PL2 is illustrated in FIG. 3. The output joining circuit 22 may take many different forms, with some of the possible designs being shown in FIGS. 4 and 6. In another embodiment using differential logic, the system and shadow pulse latches PL1 and PL2 also may provide an inverted system latch signal and an inverted shadow latch signal, respectively, as will be shown in FIG. 3. In other words, the system pulse latch PL1 may provide a non-inverted and an inverted system latch signal and the shadow pulse latch PL2 may provide a non-inverted and an inverted shadow latch signal.

Referring to FIG. 3, there is shown an illustrative pulse latch 30, implementing differential logic, which may be used for the pulse latches PL1 and PL2 of FIG. 2, according to one embodiment of the present invention. The pulsed system clock signal PCK may be coupled to a pair of gates of N-channel transistors N1 and N2. The input data signal D may be coupled to the source of the transistor N1 and the source of the transistor N2 through an inverter 31. The transistors N1 and N2 may form a gate to allow the input data signal D and an inverted input data signal to reach a storage element 32, formed by a pair of inverters 33 and 34. When the pulsed system clock signal PCK is low, the transistors N1 and N2 are off, preventing the data input signal D (and its inverted form) from reaching the storage element 32. When the pulsed system clock signal PCK is high, the transistors N1 and N2 are turned "on" so as to allow the data input signal D to reach the storage element 32 and thereby be provided at a latch output terminal O as a latch signal O. Within the storage element 32, an inverted version of the data input signal D may exist; hence, it also may be provided at another latch output terminal O# as a latch signal O#. The latch signals O and O# may comprise a pair of differential signals. Note that the labels "O" and "O#" are used to identify both the latch signals O and O# and the output terminals O and O# on which the latch signals O and O# are provided. This labeling practice is followed with other signals. The symbol "#" indicates the inverted version of the signal.

More specifically, the pulse latch 30 may be turned on at one edge of the clock pulse (e.g., the rising edge) and may be turned off at the second edge of the clock pulse (e.g., the falling edge). When the pulse latch 30 is turned on, the data signal D is passed on to the storage element 32. The value of the data input signal D at the time the pulse latch 30 is turned off is maintained by the storage element 32. Consequently, the latch signals O and O# are maintained at the latch outputs until the next rising edge of another clock pulse of the pulsed system clock signal PCK is received. Any changes in the data input signal D will not be stored in the pulse latch 30 while it is turned off. In this embodiment, differential logic may be used (generating latch signal O and its complement, latch signal O#). Generally, every embodiment herein implemented with differential logic also may be implemented without differential logic. Differential logic may increase speed and improve reliability.

It should be appreciated that the pulse latch 30 is just one of many possible pulse latch designs, with or without differential logic, which may be used with the latch hardening cell 20. For example, the pulse latch 30 of FIG. 3 may be modified to be a non-differential pulse latch by merely eliminating the inverted latch output terminal O#. Hence, for each embodiment discussed hereinafter, there may be a differential logic version and a non-differential logic version.

Figures 4, 5:
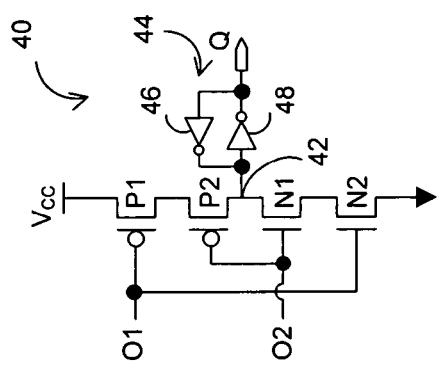
FIG. 4 is a circuit schematic of an embodiment of a C-element circuit which may be used in the latch hardening cell of FIG. 1, according to one embodiment of the present invention.
FIG. 5 is a truth table for the C-element of FIG. 4, according to one embodiment of the present invention.

Referring to FIG. 4, a first embodiment of the output joining circuit 22 of FIG. 2 is shown which may be used with a non-differential logic version of the latch hardening cell 20 of FIG. 2 and with other non-differential logic embodiments to be discussed hereinafter. The output joining circuit 22 of FIG. 2 may comprise a C-element circuit 40 of FIG. 4, which uses a single-ended, complementary metal oxide semiconductor (CMOS) implementation. The C-element is sometimes referred to as a Muller C-element. The C-element circuit 40 may include two series-coupled P-channel transistors P1 and P2 and two series-coupled N-channel transistors N1 and N2. The transistor P1 may have its source coupled to the external supply voltage $V_{CC}$ and its drain coupled to the source of transistor P2. The transistor P2 may have its drain connected to an output node 42 for the data output signal Q. The transistor N1 may have its drain coupled to the output node 42 and its source may be connected to the drain of the transistor N2. The transistor N2 may have its source coupled to ground. The gates of transistors N2 and P1 may be commonly coupled to a system latch signal O1 (biasing voltage) of the system pulse latch PL1. The gates of transistors N1 and P2 may be commonly coupled to the shadow latch signal O2 (biasing voltage) of the shadow pulse latch PL1.

Referring to FIG. 5, a truth table 49 is shown for the C-element circuit 40 of FIG. 4, according to one embodiment of the present invention. The C-element circuit 40 may have as inputs the system and the shadow latch signals O1 and O2 and may have as an output the data output signal Q. As illustrated in truth table 70, the output of C-element circuit 40 may be low upon both the signals O1 and O2 being low. The output may be high upon the signals O1 and O2 being high. For all other input combinations, the output of the C-element circuit 40 may hold its previous value. The data output signal Q at the data output terminal Q of the C-element circuit 40 may be actively driven only if the contents of two pulse latches PL1 and PL2 of FIG. 2 match (signal O1=signal O2). If any pulse latch signal is erroneous due to a particle strike, the signal O1 will not agree with signal O2 and the correct state may be at the data output terminal Q. It is assumed that no soft errors occur during the relatively short time interval when pulsed system clock signal PCK is high. It also is assumed that there is only a "single" event upset (SEU), wherein a particle strike can at most flip the contents of one of the pulse latches PL1 or PL2, but not both.

In one embodiment, a keeper circuit 44, which may include two inverters 46 and 48, may be coupled to the C-element circuit 40. In another embodiment, the keeper circuit 44 may not be needed. The keeper circuit 44 may fight leakage current in the C-element circuit 40 when both the pull-up and the pull-down paths in the C-element circuit 40 are shut off. Depending on the process technology and the clock frequency, the keeper circuit 40 may be desirable. A particle strike in the keeper circuit 44 is less likely to cause an error at the data output terminal Q, because both pulse latches PL1 and PL2 hold correct logic values under single event upset (SEU) assumption; hence, the Q output node may be strongly driven by the C-element circuit 40. The addition of the keeper circuit 44 does not change the operation of the C-element circuit 40. The term "C-element circuit" is not intended to include the keeper circuit.

Figure 6A:
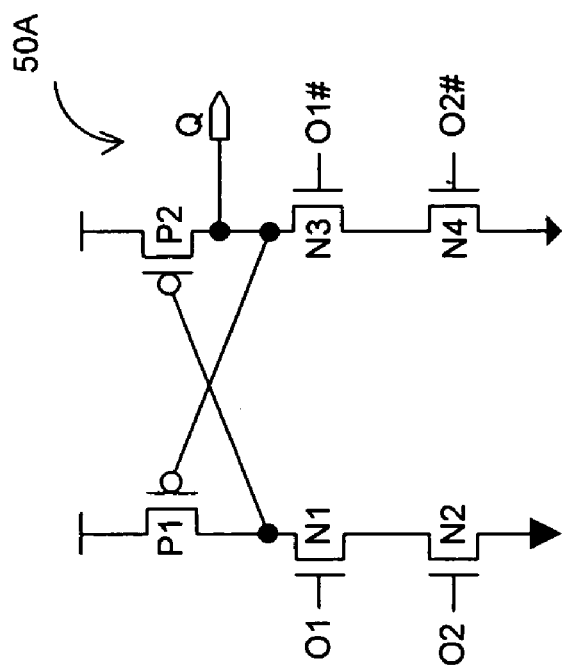
FIGS. 6 and 6A are circuit schematics of another embodiment of the C-element circuit which may be used in the latch hardening cell of FIG. 1, according to one embodiment of the present invention.
Figure 6:
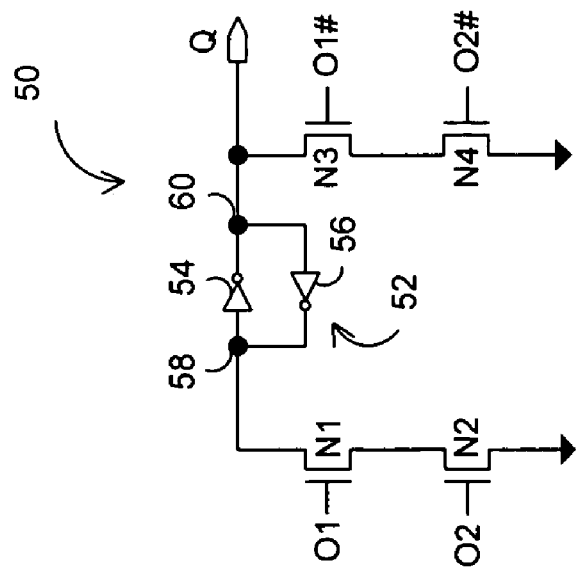

Referring to FIG. 6, another embodiment of the output joining circuit 22 of FIG. 2 is shown which may be used with a differential logic version of the latch hardening cell 20 of FIG. 2 and with other differential logic embodiments to be discussed hereinafter. The output joining circuit 22 of FIG. 2 may comprise a C-element circuit 50 of FIG. 6, which uses a differential CMOS implementation. As shown, the C-element circuit 50 assumes that differential logic is used. In one embodiment, a keeper circuit 52 may include a pair of inverters 54 and 56 coupled together at a pair of nodes 58 and 60 of the C-element circuit 50. A transistor N1 may have its drain coupled to the node 58 and its source may be connected to the drain of a transistor N2. The transistor N2 may have its source coupled to ground. A transistor N3 may have its drain coupled to the node 60 and its source may be connected to the drain of a transistor N4. The transistor N4 may have its source coupled to ground. The gates of transistors N1 and N2 may be coupled to the system latch signal O1 and the shadow latch signal O2, respectively, outputted from the system pulse latch PL1 and the shadow pulse latch PL2, respectively, of FIG. 2. The gates of transistors N3 and N4 may be coupled to the inverted system latch signal O1# and the inverted shadow latch signal O2#, respectively, of the system pulse latch PL1 and the shadow pulse latch PL2, respectively, of FIG. 2. The term "C-element circuit" is not intended to include the keeper circuit. The truth table of FIG. 5 is also applicable to the C-element circuit 50, with the signals O1# and O2# having opposite logic values from the signals O1 and O2. In another embodiment, the double-ended C-element, to be provided hereinafter, may be designed to exclude the keeper circuit.

Like the keeper circuit of the single-ended C-element circuit of FIG. 4, the keeper circuit 52 of FIG. 6 may not be needed under the circumstances described above with respect to FIG. 4. However, to exclude the keeper 52 from use with the C-element 50 of FIG. 6, some additional modifications to the C-element circuit may be needed in addition to merely eliminating the attached keeper circuit 52. These modifications are shown in FIG. 6A. The C-element circuit 50A is shown which may include a pair of cross-linked P-channel transistors P1 and P2, which have their sources coupled to the power voltage and their drains coupled to the sources of the transistors N1 and N2, respectively. The rest of the C-element circuit 50A is the same as the C-element circuit 50 of FIG. 6. When use of the C-element circuit 50 of FIG. 6 is referred to in the various embodiments described hereinafter, such use may also include the C-element circuit 52A of FIG. 6A.

In another embodiment, the output joining circuit 22 may simply comprise coupling the system latch output terminal O1 and the shadow latch output terminal O2 together so that the system latch signal O1 and the shadow latch signal O2 combine to produce the data output signal Q. In another embodiment, the output joining circuit 22 may be a transmission gate coupled between the system and the shadow latch output terminals O1 and O2 so that the system latch signal O1 and the shadow latch signal O2 are coupled together to produce the data output signal Q when the transmission gate is enabled to conduct. The transmission gate may also decouple the signals O1 and O2 when the transmission gate is disabled to not conduct.

Figure 7:
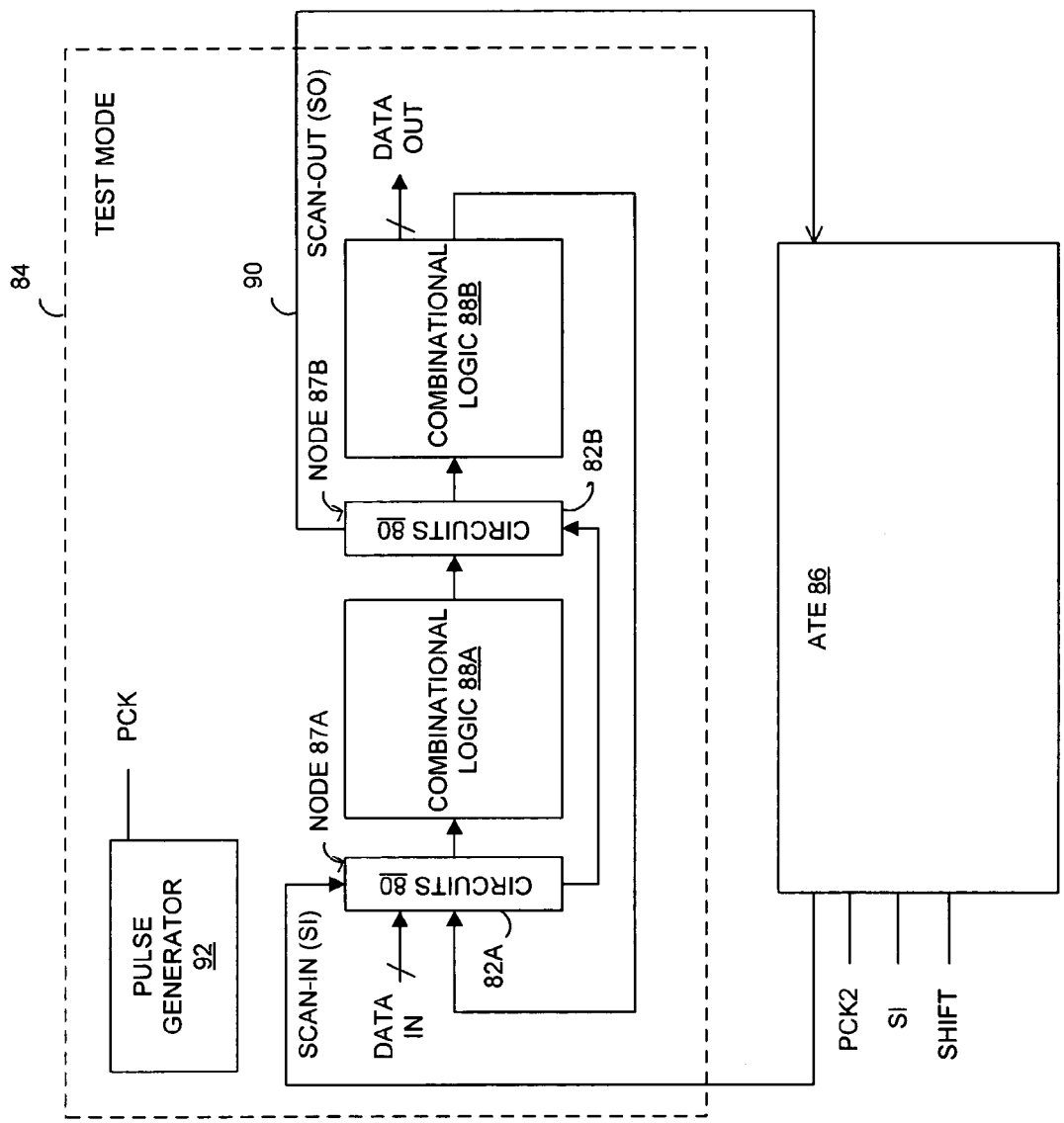
FIG. 7 is a block diagram of an integrated circuit (IC) chip in a test mode of operation with its latch hardening cells and/or hardening/scan cells, according to various embodiments of the present invention, chained together and coupled to automatic test equipment.
Figure 8:
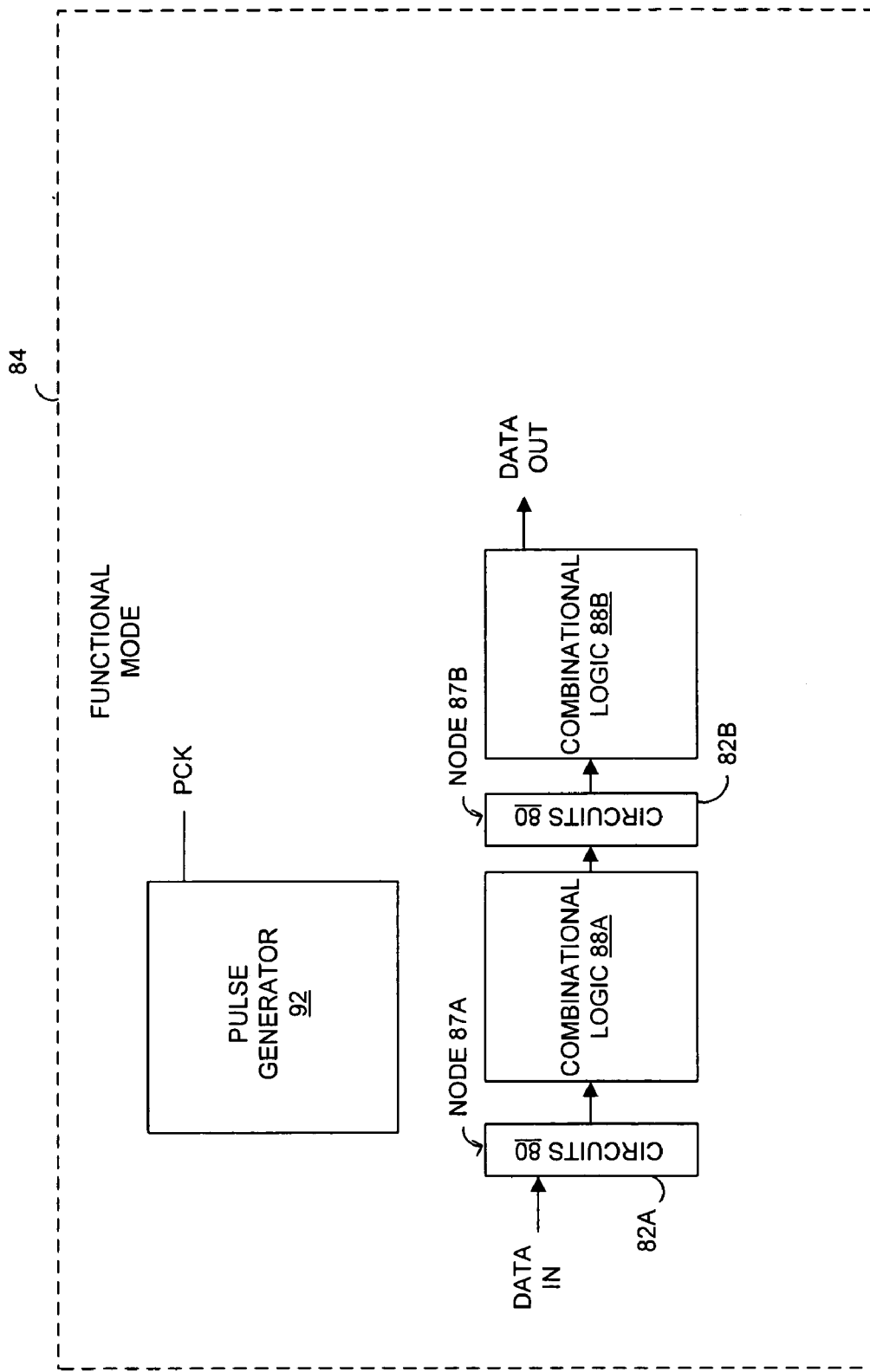
FIG. 8 is a block diagram of the IC chip of FIG. 7 in a functional mode of operation, according to the various embodiments of the present invention.

Latch hardening cells which may also be used for DFT scan ("hardening/scan cells"), according to various embodiments of the present invention, are discussed hereinafter and incorporate the previously described "reuse concept" for a shadow latch. In these embodiments, the shadow latch is part of a scan circuit, which is used in an integrated circuit (IC) for a DFT scan purpose. FIGS. 7 and 8 illustrate the general environment for implementing these hardening/scan cells. More specifically, FIG. 7 shows a plurality of hardening/scan cells 80 in a test mode of operation. FIG. 8 shows the plurality of hardening/scan cells 80 in a functional mode of operation. Each hardening/scan cell 80 includes a system pulse latch and a scan circuit having a shadow pulse latch, coupled to an output joining circuit, as will be described in the various embodiments hereinafter. In this latch-based clocking system, a group of pulse latches may be used in registers 82 to be described hereinafter.

Referring to FIG. 7, an integrated circuit (IC) chip 84, simplified for illustrative purposes, is shown as a Device-Under-Test (DUT) utilizing scan DFT, according to one embodiment of the present invention. The IC chip 84, coupled to an automatic test equipment (ATE) 86, includes registers 82 (two illustrative registers 82A and 82B shown) at nodes 87 (two illustrative nodes 87A and 87B shown) and combinational logic circuits 88 (two illustrative logic circuits 88A and 88B shown) interposed between nodes 87. Each register 82 may be an N-bit-wide clocked register; hence, each register 82 may have N hardening/scan cells 80 to receive an N-bit wide data input signal DATA IN. Scan DFT may avoid the known sequential-test problems by turning the scan circuits of the hardening/scan cells 80 at input and output nodes 87 of combinational logic circuits 88 into externally loadable and readable elements. During this test mode, the scan circuits of the hardening/scan cells 80 may be chained together as one or more serial shift registers to form one or more scan paths 90 (sometimes referred to as "scan chain"). In a scan-in shift operation, serial data of an appropriate test pattern or sequence (scan-in signal) may be loaded into the scan circuits of the hardening/scan cells 80 to set each of the cells 80 to a predetermined state. Once set, the test pattern may propagate through the combinational logic circuits 88 to generate a system response to the test pattern. In a capture operation, the hardening/scan cells 80 may function to latch (capture) the system response. In a scan-out shift operation, the system response (scan-out signal SO) may be shifted out of the IC chip 84 and analyzed for improper operation. A pulse generator 92 may provide a system pulsed system clock signal PCK. The ATE 86 may provide various other signals used during the test mode, such as a pulsed scan clock signal PCK2, a scan-in signal SI, and a signal SHIFT to be described hereinafter in the description of a specific hardening/scan circuit of FIG. 9. For the other embodiments discussed hereinafter, the ATE 86 may generate other signals (not shown). Referring to FIG. 8, the hardening/scan cells 80 in the IC chip 84 are shown configured in their functional mode of operation.

Three embodiments of the hardening/scan cell 80 will now be described, with the illustrated versions using differential logic. However, each of these embodiments may be implemented without using differential logic. These embodiments may achieve soft error protection in very similar ways during normal system operation (functional mode of operation). They may differ from one another in the way the test mode of operation is performed. A fourth embodiment is provided to illustrate how the previously-mentioned three embodiments may be implemented without differential logic.

Figure 9:
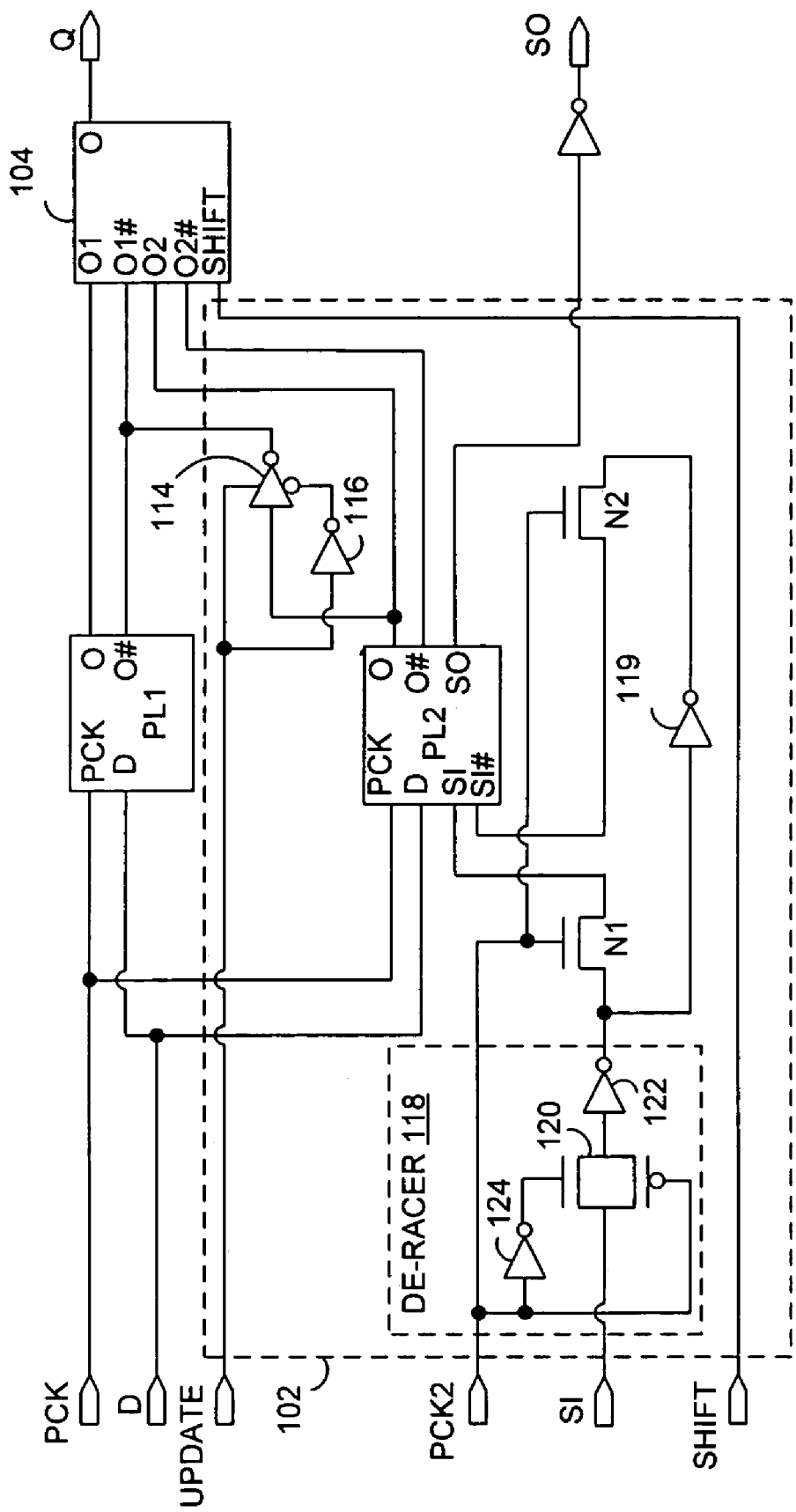
FIG. 9 is a circuit schematic of a hardened/scan cell, according to one scan reuse embodiment of the present invention.

Referring to FIG. 9, each of the hardening/scan cells 80 of FIGS. 7 and 8 may take the form of a hardening/scan cell 100 of FIG. 9, according to one scan circuit reuse embodiment of the present invention. The hardening/scan cell 100 may include a system pulse latch PL1, a scan circuit 102 having a shadow pulse latch PL2, and an output joining circuit 104. The scan circuit 102, in addition the shadow pulse latch PL2, may include interface circuitry for signals between the pulse latches PL1 and PL2 and to receive and send various signals, as will be described hereinafter.

Figure 10:
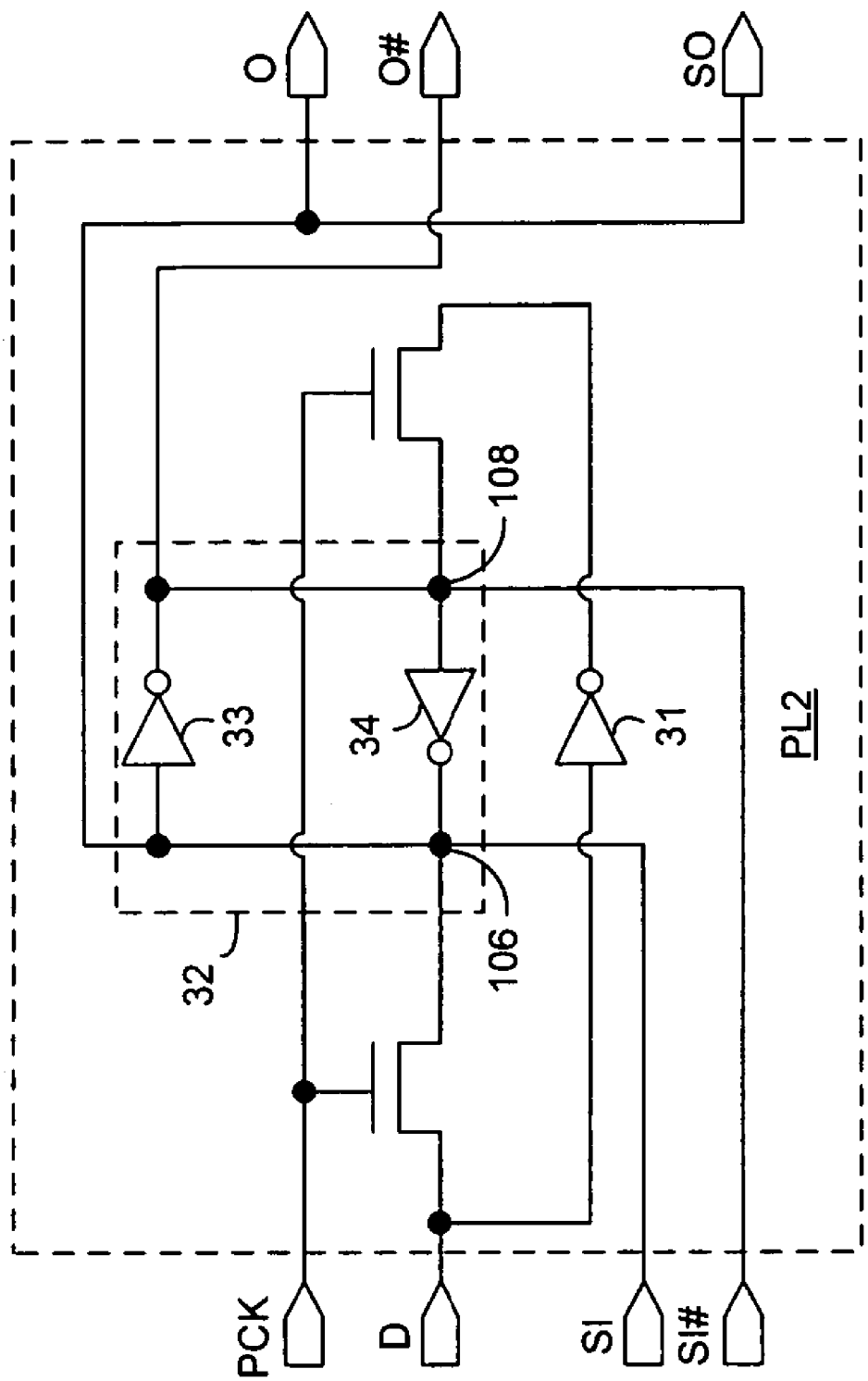
FIG. 10 is a circuit schematic of a shadow pulse latch which may be used in the hardening/scan cell of FIG. 9, according to one embodiment of the present invention.

Referring to FIGS. 3, 9 and 10, in one embodiment, the pulse latch PL1 of FIG. 9 may be the pulse latch 30 of FIG. 3. In one embodiment, the pulse latch PL2 of FIG. 9 may be the same as PL1, except the scan-in signal SI and the signal SHIFT are coupled to nodes 106 and 108, respectively, as shown in FIG. 10 (the rest of FIG. 10 has been described in the description of FIG. 3).

Figure 12:
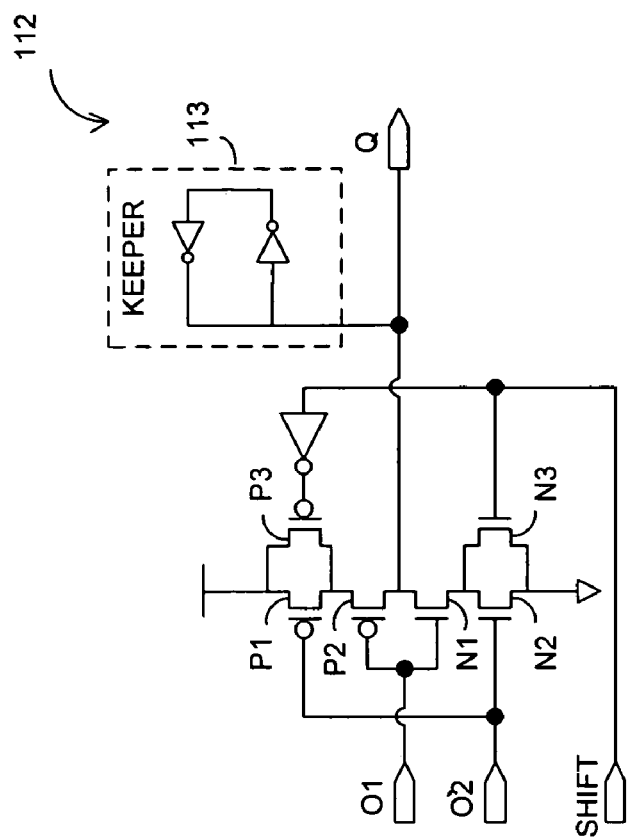
FIG. 12 is a circuit schematic of an embodiment of a single-ended C-element circuit which may be used in the hardening/scan cell of FIG. 9, according to one embodiment of the present invention.
Figure 11:
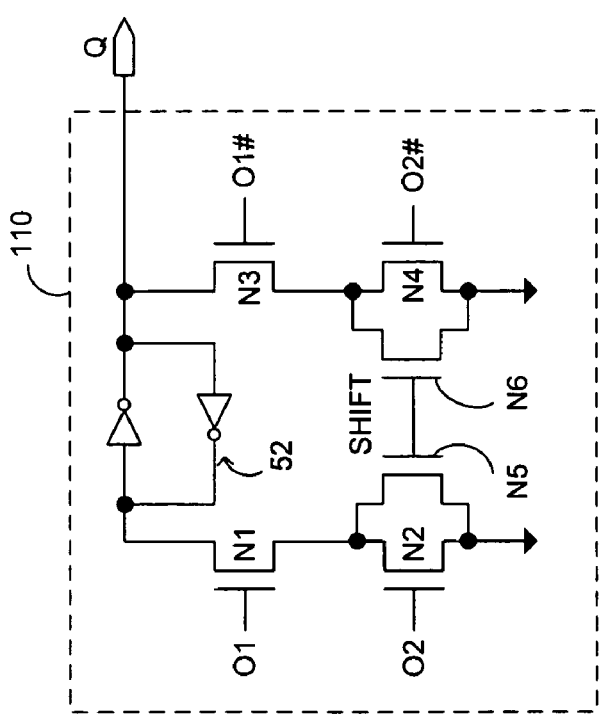
FIG. 11 is a circuit schematic of an embodiment of a double-ended C-element circuit which may be used in the hardening/scan cell of FIG. 9, according to one embodiment of the present invention.

Referring to FIGS. 9, 11, and 12, in one embodiment, the output joining circuit 104 of the FIG. 9, using differential logic, may take the form of a double-ended C-element circuit 110 is shown in FIG. 11. The C-element circuit 110 of FIG. 11 is the same as FIG. 6, except a pair of N-channel transistors N5 and N6 (disabling transistors) may be placed in parallel with the transistors N2 and N4, respectively. The gates of the disabling transistors N5 and N6 may be coupled to the signal SHIFT. It should be noted that when both signals O to the C-element 110 are high, the data output signal Q is high (also true for FIG. 6). Since the rest of FIG. 11 is the same as FIG. 6, FIG. 11 will not be described further. Additionally, when a keeper circuit is not needed, the double ended C-element 52A of FIG. 6A may be used by modifying it in the same manner so as to have a pair of disabling transistors in parallel with the transistors N2 and N4. Hence, in the various embodiments, where reference is made to using the C-element 110 of FIG. 11, this may also include the C-element 110 modified to not be attached to a keeper circuit as shown in FIG. 6A.

The output joining circuit 104 of FIG. 9, when modified not have differential logic, may take the form of a single-ended C-element circuit 112 shown in FIG. 12. The C-element circuit 112 of FIG. 12 is the same as FIG. 4, except a P-channel transistor P3 and an N-channel transistor N3 (disabling transistor) may be placed in parallel with the transistors P1 and N2, respectively. Unlike the keeper circuit 44 of FIG. 4, no inverter of a keeper circuit 113 is coupled directly into the output node for Q. However, in another embodiment, the keeper circuit 44 of FIG. 4 may be used with the C-element 112. Depending upon which keeper circuit is used, the polarity of the data output signal will change. For example, in FIG. 12, the truth table of FIG. 5 would be modified so that when both signals O are high, Q is low and when both signals O are low, Q is high. Since the rest of FIG. 12 is the same as FIG. 4, FIG. 12 will not be described further.

In both FIGS. 11 and 12, one of the C-element circuits 110 and 112 may be selected based upon whether or not differential logic is used. Both C-element circuits 110 and 112 may include (1) a shadow latch signal enabled state wherein the C-element circuit may be configured to be responsive both to the system latch signal and the shadow latch signal during the functional mode of operation and (2) a shadow latch signal disabled state wherein the C-element circuit may be configured to be responsive only to the system latch signal during the test mode of operation, with the shadow latch signal enable state or the shadow latch signal disabled state being selected in response to the signal SHIFT. In other words, the signal SHIFT may disable the shadow latch signal of the shadow pulse latch PL2 from affecting the C-element circuits 110 and 112. As previously described, the output joining circuit 104 may also take the form of merely coupling the latch output terminals O1 and O2 together or coupling them together with a transmission gate. In FIG. 9, the output joining circuit 104 is illustrated as having the input terminals of the C-element circuit 110 with differential logic.

Referring to FIG. 9, the scan circuit 102 may include the shadow pulse latch PL2 and interface circuitry for various input and output signals and for signals between the pulse latches PL1 and PL2. This interface circuitry may include a tri-state enable inverter 114 which may have three input terminals, with one input terminal coupled to a signal UPDATE, one input terminal coupled to the signal UPDATE through an inverter 116, and one input terminal coupled to the output O of the pulse latch PL2. A high state of the signal UPDATE enables the inverter 116 to invert the shadow latch signal O. In one embodiment, the interface circuitry may include a pair of N-channel transistors N1 and N2 coupled to the scan-in signal SI and the inverted scan-in signal SI# (# means inverted) inputs. The gates of the transistors N1 and N2 may be coupled to a pulsed scan clock signal PCK2. In one embodiment, a de-racer circuit 118 may be included. In another embodiment, the de-racer circuit 118 is not included. In the embodiment where the de-racer circuit 118 is not included, the scan-in signal SI may be directly coupled to the transistor N1 and to the transistor N2 through an inverter 119. In the embodiment where the de-racer circuit 118 is included, the scan-in signal SI may be connected to a pass-gate 120 of the de-racer circuit 118, which in turn has an output coupled through an inverter 122 to the transistors N1 and N2. A P-transistor of the pass gate 120 is coupled through an inverter 124 to the pulsed scan clock signal PCK2 and an N-transistor of the pass-gate 120 is coupled to the signal PCK2. A high state of the pulsed scan clock signal PCK2 enables the pass-gate to pass through the scan-in signal SI.

A data input signal D may be commonly coupled to a D input of the system pulse latch PL1 and a D input of the shadow pulse latch PL2. A system pulsed system clock signal PCK may be commonly coupled to a PCK clock input of the system pulse latch PL1 and a PCK clock input of the shadow pulse latch PL2. A system latch signal O of the system pulse latch PL1 may be coupled to the input O1 of the output joining circuit 104. The inverted system latch signal O# of the system pulse latch PL1 may be coupled, along with the output of the tri-state enable inverter 114, to input O1# of the output joining circuit 104. A shadow latch signal O of the shadow pulse latch PL2 may be coupled to the input O2 of the output joining circuit 104 and also coupled to the input of the inverter 114. An inverted shadow latch signal O# of the shadow pulse latch PL2 may be coupled to the input O2# of the output joining circuit 104. The output joining circuit 104 may generate at a data output terminal Q an output data signal Q and the shadow pulse latch PL2 may generate at a scan-out terminal SO a scan-out signal SO.

The hardening/scan cell 100 may have a test mode of operation and a functional mode of operation as previously described with respect to FIGS. 7 and 8. In the functional mode of operation the output joining circuit 104 may be configured for error reduction (increased resilience or hardening against errors). The operation of the hardening/scan cell 100 will now be described with respect to timing diagrams of FIGS. 13 and 14.

With reference to FIGS. 9 and 13, the test mode of operation of the hardening/scan cell 100 is shown in the timing diagram of FIG. 13, according to one embodiment of the present invention. In a phase I of FIG. 13, a pulsed scan clock signal PCK2 may used to shift test pattern (sequence) into the shadow pulse latch PL2 in a scan-in operation. In some implementations, more than one pulse of the pulsed scan clock signal PDK2 may be used to move the test pattern into a position to be applied to the combinational logic circuits; hence, a second pulse is shown in dashed lines. Because the signal SHIFT is high during this scan-in shift operation, this shift operation may not affect the output logic value at the data output terminal Q of the output joining circuit 104. This is because the output of the shadow pulse latch provided to the output joining circuit 104 as an input may be effectively disabled while the signal SHIFT is high. In other words, when the output joining circuit 104 is the C-element circuit 110 of FIG. 11, the transistors N2 and N4 of the C-element circuit 110 may be short circuited by the disabling transistors N5 and N6 in their "on" or conducting state when the signal SHIFT is high, so as to prevent any toggling of the transistors N2 and N4 by the shadow latch signals O and O# from the shadow pulse latch PL2 (connected to the O2 and O2# input terminals of the C-element 110), thereby preventing the shifting operation from affecting the data output signal Q of the output joining circuit 104. In a phase II, the signal UPDATE may transition high, which connects the test data of the test pattern from the latch output O of the shadow pulse latch PL2 to the O1# input terminal of the output joining circuit 104. The value of the data output signal Q from the output joining circuit 104 may now be determined by the contents of both the system and the shadow latches PL1 and PL2, because signal SHIFT is low. In a phase III, a system response to test data may be captured during a capture operation using a clock pulse of the pulsed system clock signal PCK while keeping signal SHIFT low. Although only one clock pulse of the pulsed system clock signal PCK is needed in this embodiment, with some advance testing functions, a second pulse is desirable. Hence, a second pulse is shown in dashed lines for the pulsed system clock signal PCK. In a phase IV, the system response may be shifted out in a shifting-out operation via a shift register (see scan path 90 of FIG. 7) comprising the chained together shadow pulse latches PL2. During this shifting-out operation, the signal SHIFT again may be high so as to disable the inputs from the shadow pulse latch PL2. The de-racer circuit 118 may reduce the design effort involved in a scan path 90 of FIG. 7 comprising the shadow pulse latches PL2, because a min-delay issue may be eliminated. However, inclusion of the de-racer circuit 118 may not be needed if designers perform sufficient verifications on the scan path.

Referring to FIGS. 9 and 14, a timing diagram for the functional mode of operation is shown in FIG. 14, according to one embodiment of the present invention. The signals SHIFT, PCK2, and UPDATE are low. The pulsed system clock signal PCK may be used to latch the input data signal D at both the pulse latches PL1 and PL2. A more detailed explanation was previously provided with respect to FIG. 3.

The hardening/scan cell 100 of FIG. 9 is a hardened pulse latch with "hold scan" capability as opposed to "non-hold scan" capability, with the hold scan capability being controlled by the signal SHIFT. Hold scan may be needed to prevent output toggling during the shift in and shift out operations described above, where random data may hit an output logic cone. For domino logic, the precharge may be active during the shifting operations. The random data may cause contention problems with domino logic or any precharged circuits, as well as unnecessary logic activities which raise the power level. The raised power level may generate unnecessary heat or may even damage the devices. The N-pull down transistors of the output joining circuit 104 may drain the logic states with random patterns coming through the scan shifting. The hold scan capability may avoid these contention issues. Also, hold scan capability may also helps avoid contention in multiplexer structures, e.g. an internal bus, where multiple gate/driver could end up driving the same node (and hence contending with one another) if a select signal for the multiplexer is assigned "illegal" values (which enables multiple drivers) due to non-hold scan. The term "non-hold scan" refers the scan function without hold scan capability.

Figure 15:
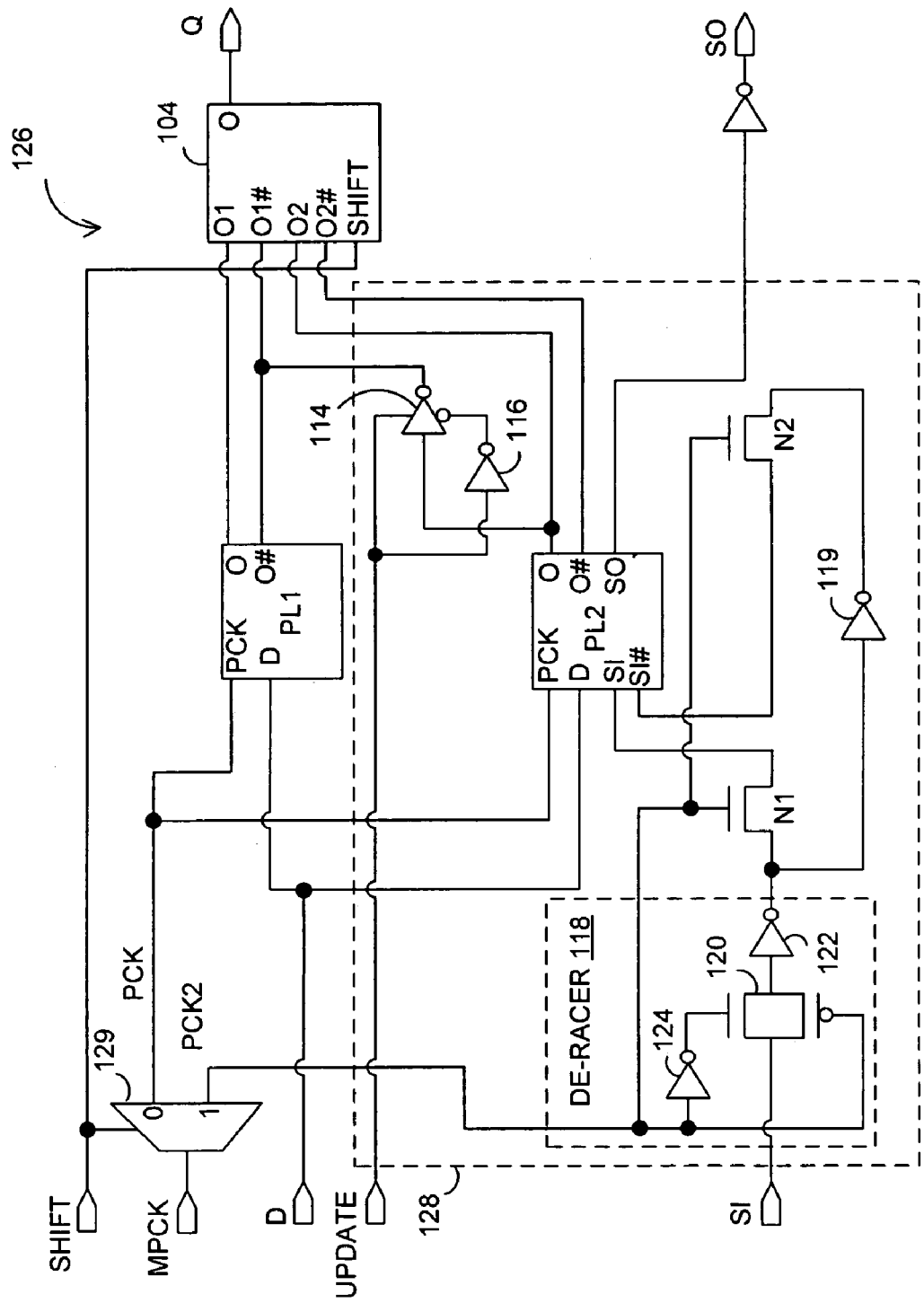
FIG. 15 is a circuit schematic of a hardened/scan cell, according to another scan reuse embodiment of the present invention.

Referring to FIG. 15, each of the hardening/scan cells 80 of FIGS. 7 and 8 may take the form of a hardening/scan cell 126 of FIG. 15, according to another scan circuit reuse embodiment of the present invention. The hardening/scan cell 126 is the same as the hardening/scan cell 100 of FIG. 9 except modifications have been made so that the independent pulsed scan clock signal PCK2 of FIG. 9 for shifting test sequence may be eliminated. Instead, both the pulsed system clock signal and the pulsed scan clock signal may be derived from the same clock source. Hence, that portion of the hardening/scan cell 126 which remains the same will retain the same reference numbers and will not again be described. Again, the hardening/scan cell 126 may include a system pulse latch PL1, a scan circuit 128 having a shadow pulse latch PL2, and an output joining circuit 104.

The scan circuit 128 may be modified to include a multiplexer 129. The multiplexer 129 may receive as an input a pulsed clock signal MPCK. The signal SHIFT may be coupled to the multiplexer 129 to be a select signal for the two outputs of the multiplexer 129, which are labeled as outputs 0 and 1. The output 0 of the multiplexer 129 may be coupled to the PCK input of the system pulse latch PL1 to provide a pulsed system clock signal PCK to the pulse latch PL1. The output 1 may be coupled to the PCK input of the shadow pulse latch PL2 to provide a pulsed scan clock signal PCK2 to the de-racer 118.

The hardening/scan cell 126 does not need an independent pulsed scan clock signal PCK2 for shifting test sequence. The cell 126 may still shift the test sequence by using the shadow pulse latch PL2. However, both the pulsed scan clock signal PCK2 (controlling test sequence shifting by pulse latch PL2) and pulsed system clock signal PCK (controlling regular data latching) may be derived from the single pulsed clock source MPCK. In operation, the cell 126 may have the same clock waveforms of FIGS. 13 and 14 as provided for the hardening/scan cell 100 of FIG. 9.

Figure 16:
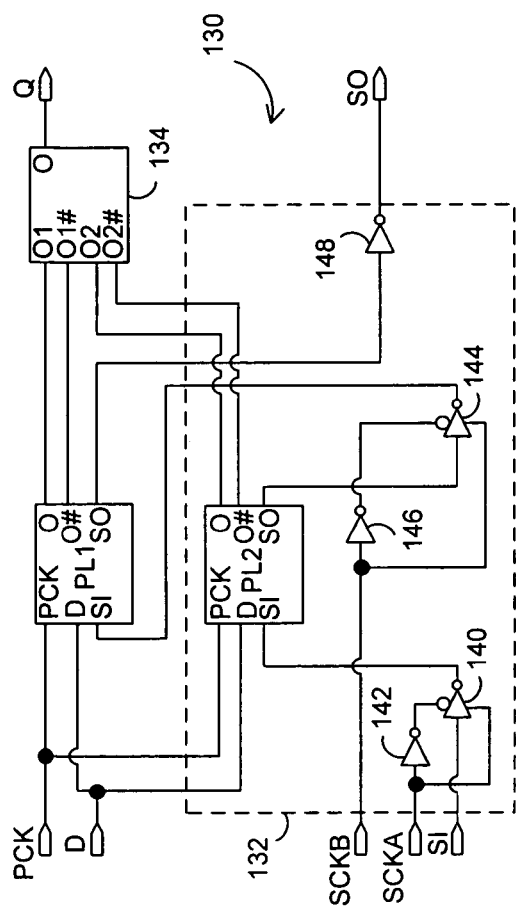
FIG. 16 is a circuit schematic of a hardened/scan cell, according to yet another scan reuse embodiment of the present invention.

Referring to FIG. 16, each of the hardening/scan cells 80 of FIGS. 7 and 8 may take the form of a hardening/scan cell 130 of FIG. 16, according to another scan circuit reuse embodiment of the present invention. The hardening/scan cell 130 may include a system pulse latch PL1, a scan circuit 132 having a shadow pulse latch PL2 and interface circuitry, and an output joining circuit 134. The hardening/scan cell 130 may follow a level-sensitive scan design (LSSD) style. Again, the hardening/scan cell 130 may be implemented in a differential logic version and a non-differential logic version, with the differential logic version being illustrated in FIG. 16.

Figure 17:
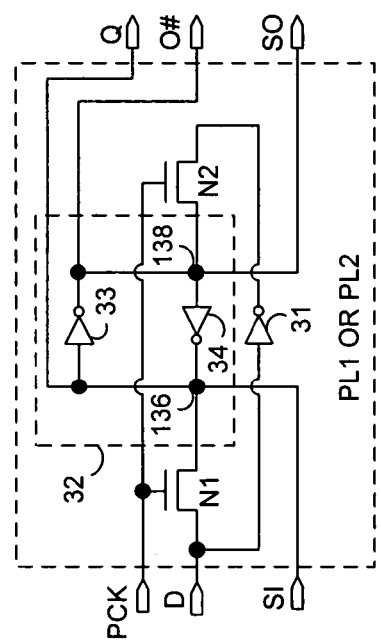
FIG. 17 is a circuit schematic of a shadow pulse latch which may be used in the hardening/scan cell of FIG. 16, according to one embodiment of the present invention.

Referring to FIGS. 16 and 17, in one embodiment, the pulse latches PL1 and PL2 of FIG. 16 may be the pulse latch of FIG. 17. The pulse latch of FIG. 17 is the same as the pulse latch of FIG. 3 except a scan-in signal SI is coupled to a node 136 and a scan-out signal SO is obtained from a node 138. Since the rest of the pulse latch of FIG. 17 is the same as the pulse latch of FIG. 3, the remaining elements will have the same reference numerals as FIG. 3 and will not be further described. In this differential logic embodiment, the output joining circuit 134 may be the C-element circuit 50 of FIG. 6. A non-differential version of the pulse latch circuit of FIG. 17 may be provided by eliminating the latch output terminal O#. In this non-differential logic embodiment, the output joining circuit 134 may be the C-element circuit 40 of FIG. 4. In another embodiment, the system and shadow output terminals may be directly coupled or coupled with a transmission gate.

Referring back to FIG. 16, the scan circuit 132 includes the shadow pulse latch PL2 and interface circuitry for various signals and between the pulse latches PL1 and PL2. The interface circuitry may include a first tri-state enable inverter 140 which may have three input terminals, with one input terminal coupled to a scan clock signal SCKA, one input terminal coupled to an inverted scan clock signal SCKA through an inverter 142, and one input terminal coupled to a scan-in signal SI. The tri-state enable inverter 140 may have an output coupled to an SI input of the shadow pulse latch PL2. A high state of the scan clock signal SCKA enables the inverter 140 to pass an inverted version of the scan-in signal SI to the shadow pulse latch PL2. This interface circuitry also may include a second tri-state enable inverter 144 which may have three input terminals, with one input terminal coupled to a scan clock signal SCKB, one input terminal coupled to an inverted scan clock signal SCKB through an inverter 146, and one input terminal coupled to the output SO of the shadow pulse latch PL2. The tri-state enable inverter 144 may have an output coupled to the SI input of the system pulse latch PL1. A high state of the scan clock signal SCKB enables the tri-state enable inverter 144 to pass an inverted version of the signal from the output SO to the shadow pulse latch PL1. In one embodiment, the clock signals SCKA and SCKB may be generated by the ATE 86 of FIG. 7 (not shown in FIG. 7).

A data input signal D is commonly coupled to the D input of the system pulse latch PL1 and the D input of the shadow pulse latch PL2. A pulsed system clock signal PCK is commonly coupled to the PCK input of the system pulse latch PL1 and the PCK input of the shadow pulse latch PL2. An output signal O of the system pulse latch PL1 may be coupled to the input O1 of the output joining circuit 134 and the inverted output signal O# of the system pulse latch PL1 may be coupled to input O1# of the output joining circuit 134. An output signal O of the shadow pulse latch PL2 may be coupled to the input O2 of the C-element circuit 134 and the inverted signal O# of the shadow pulse latch PL2 may be coupled to input O2# of the output joining circuit 134. The output joining circuit 134 may generate an output data signal Q and the system pulse latch PL1 may generate a scan-out signal SO via an inverter 148.

The hardening/scan cell 130 may have a test mode of operation and a functional mode of operation as previously described with respect to FIGS. 7 and 8. In the functional mode of operation the output joining circuit 134 may be configured for error reduction (increased resilience or hardening against errors). The operation of the hardening/scan cell 130 will now be described with respect to timing diagrams of FIGS. 18 and 19.

Referring to FIGS. 16 and 18, the two pulse latches PL1 and PL2 may be interconnected in such a manner that they shift the test sequence in and out by alternately pulsing the two scan clock signals SCKA and SCKB, which may not be timing critical. This design may have the most relaxed requirement on the overall system design. This design may only perform non-hold scan. In the test mode of operation of the hardening/scan cell 130 is shown in the timing diagram of FIG. 18. In operation, a first pulse of the scan clock SCKA may enable the first tri-state enable inverter 140 to pass data of the test pattern (sequence) directly into the storage element 32 of the shadow pulse latch PL2 without use of the pulsed system clock signal PCK to latch the data. Repeated clock pulses of the scan clock signals SCKA and SCKB may be needed to move a test pattern into position. At this point, a scan-in operation has been completed. Thereafter, a first pulse of the scan clock SCKB may enable the second tri-state enable inverter 144 to store the data of the test pattern (obtained from the SO output of the latch PL2) directly into the storage element 32 of the system pulse latch PL2 again without use of the pulsed system clock signal PCK. The test pattern now may be applied to the data output terminal Q and the downstream combinational logic circuit (see circuits 88 in FIG. 7). At this point, an update operation of the system pulse latch PL1 with the test data has been completed. Next, one pulse of the pulsed system clock signal PCK may be applied to latch the data response from the upstream combinational logic circuit (see circuits 88 in FIG. 7). Although only one clock pulse of the system pulse clock signal PCK may be needed, with some advance testing functions, a second pulse is desirable. Hence, a second pulse is shown in dashed lines for the pulsed system clock signal PCK. This completes a capture operation. Next, the system response may be shifted out in a shifting-out operation via a shift register (see scan path 90 of FIG. 7) comprising the chained together hardening/scan cells 130. This shifting-out operation again may be accomplished by applying the scan clock signals SCKA and SCKB. More specifically, the system response is latched into the pulse frame latch PL1, which appears at the output SO of the pulse frame latch PL1. A pulse of the scan clock signal SCKA may activate the inverter 140 of the next scan circuit 132 in the scan chain so that it is stored in the pulse latch PL2 of that scan circuit 132. Next, a pulse of the scan clock signal SCKB may store the system response in the system pulse latch PL1. Alternating the scan clock signals SCKA and SCKB may move the system response through and out of the scan chain to be subsequently analyzed.

Referring to FIG. 19, a timing diagram for the functional mode of operation is shown, according to one embodiment of the present invention. The scan clock signals SCKA and SCKB are low and the pulsed system clock signal PCK may be used in the normal manner to latch the data input signal into the pulse latches PL1 and PL2. Error hardening is introduced by use of the output joining circuit 134.

Figure 20:
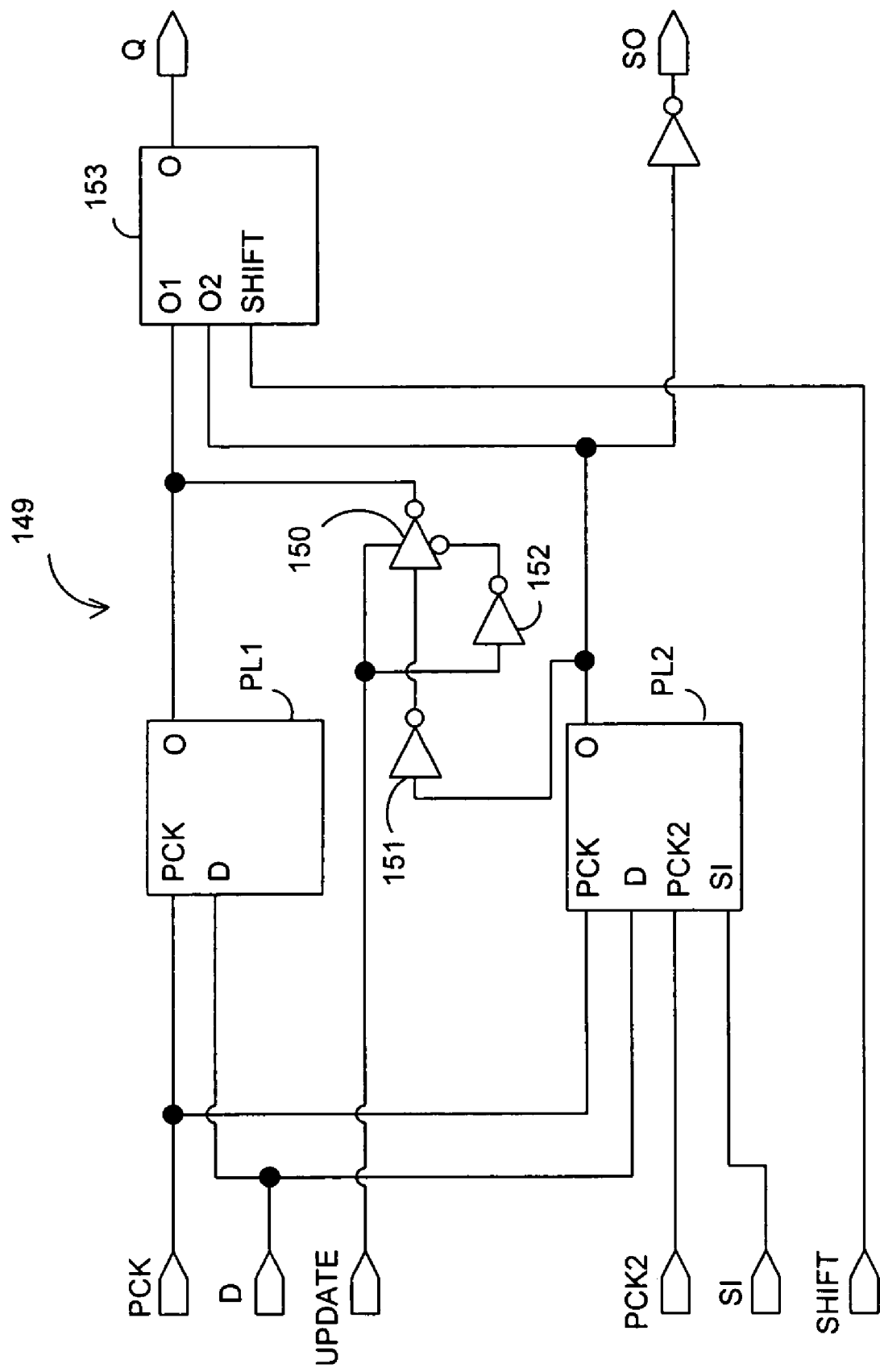
FIG. 20 is a circuit schematic of a hardening/scan cell, according to yet another scan reuse embodiment of the present invention.

Referring to FIG. 20, each of the above described embodiments of the hardening/scan cells of FIGS. 9, 15, and 16 may be implemented without using differential logic. FIG. 20 illustrates a hardening/scan cell 149 that corresponds to FIG. 9, except there is no differential logic and no de-racer circuit, according to one embodiment of the present invention. Only system latch signal O and shadow latch signal O are generated by the system pulse latch PL1 and the shadow pulse latch PL2, respectively. In other words, there are no inverted signals provided as outputs from the pulse latches PL1 and PL2. Hence, each pulse latch PL1 or PL2 does not have a pair output signals that are complements of each other, but instead each has a single output signal O. A tri-state enable inverter 150 may have inputs coupled to a latch output O of pulse latch PL2 through an inverter 151, to a signal UPDATE, and to an inverted signal UPDATE through an inverter 152. An output of the inverter 150 may be coupled to an output joining circuit 153.

Since this is a non-differential logic embodiment, the output joining circuit 153 may take the form of the C-element 40 of FIG. 4, for example. In one embodiment, the pulse latches PL1 and PL2 may take the form of the pulse latch circuit 30 of FIG. 3 with the output O# removed. In another embodiment, the pulse latches may take the form of a single ended pulse latch of FIG. 21, to be described hereinafter. Otherwise, the hardening/scan cell 149 is the same as the cell of FIG. 9 and will not be further described. The hardening/scan cells of FIGS. 15 and 16 may be modified accordingly to use non-differential logic.

Figure 21:
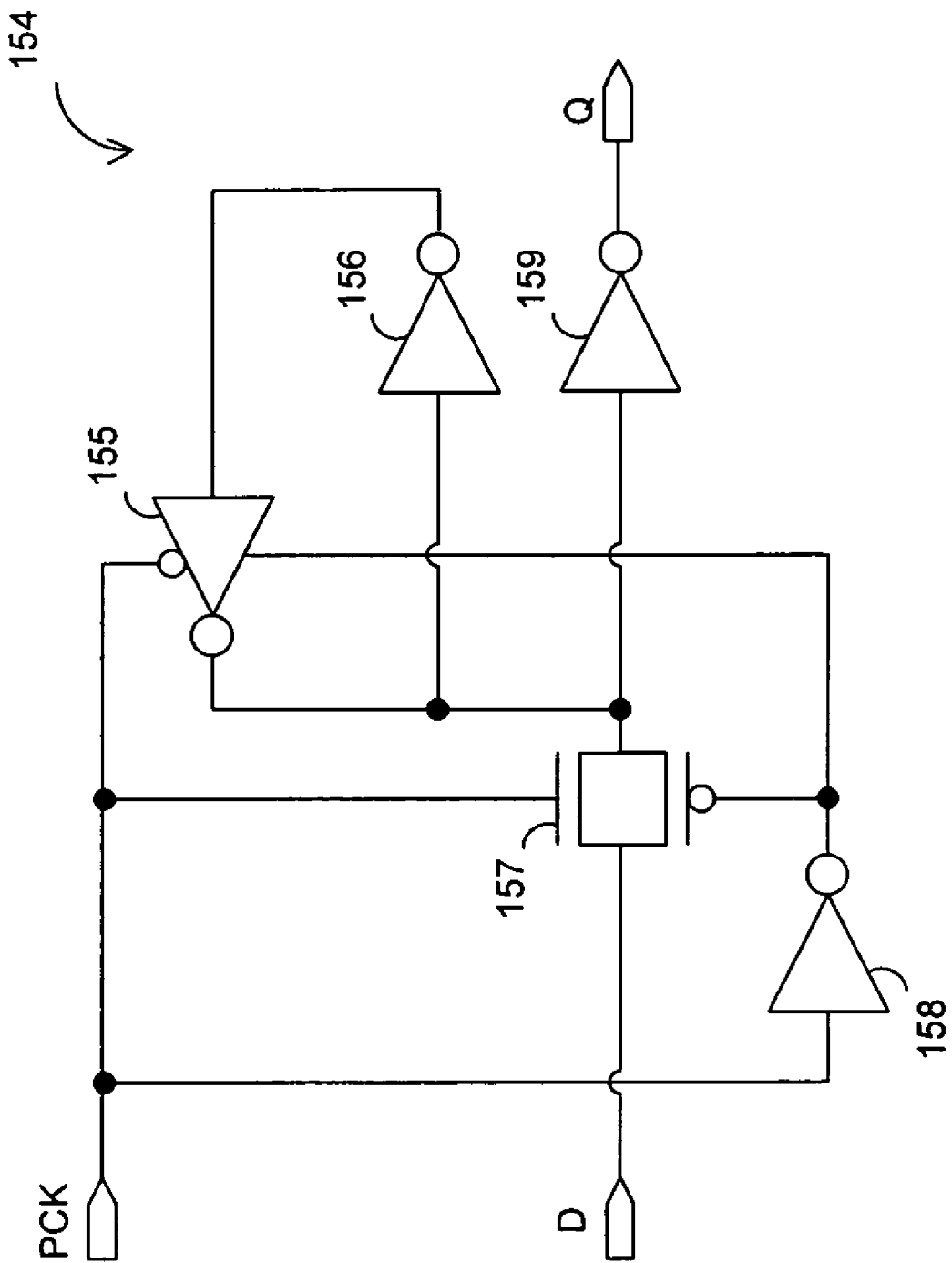
FIG. 21 is a circuit schematic a pulse latch that may be used with the hardening/scan cell of FIG. 20, according to one embodiment of the present invention.

Referring to FIG. 21, a pulse latch 154 may be used for the system pulse latch PL1 in the hardening/scan cell 149 of FIG. 20. The pulse latch 154 may also be used with the other embodiments when adapted not to have differential logic. The pulse latch 154 may include a storage element comprising a tri-state enable inverter 155 and an inverter 156. A pass gate 157 may be coupled to the system pulse clock signal PCK and to the inverted system pulse clock signal through an inverter 158. A latch output Q may be coupled to the storage element and the pass gate 157 through an inverter 159. When the clock signal PCK is high, the input data signal D may be passed on to the storage element of inverters 155 and 156. The pulse latch 154 may be modified to be used as the shadow pulse latch PL2 in the hardening/scan cell 149 of FIG. 20. The signal scan-in may be directly stored in the storage element and the scan-out signal may be obtained from the storage element.

Referring back to FIG. 2, in another embodiment of the latch hardening cell 20, the capability of disabling the shadow pulse latch PL2 may be provided so as to allow a non-hardening mode of normal operation. For example, the non-hardening mode of normal operation may be used to save power. To implement the hardening and non-hardening modes of normal operation for the latch hardening cell 20, the following modifications may be undertaken. The pulsed system clock signal PCK may be prevented from clocking the shadow pulse latch PL2 by interposing an AND gate having inputs of the pulsed system clock signal PCK and a clock enabling signal and an output coupled to the clock input terminal of the pulse latch PL2. Additionally, the output joining circuit 22 may be configured to have the system latch signal disabled at its input during the non-hardening mode of normal operation in the same manner the system latch signal is disabled during the test mode of operation for the scan reuse embodiments, as described above. The two functional modes of operation, hardening functional mode of operation and non-hardening mode of operation, may also be extended the scan-reuse embodiments described herein which have the additional test mode of operation.

In summary, the system pulse latch PL1 in the scan reuse embodiments, according to the various embodiments of the invention, is a radiation hardened scannable pulse latch. Soft error protection and hold scan functions may be achieved in system pulse latches with reduced circuitry (and thus low power). Scan generally may be needed to support manufacturing test and debug. Low SER rate may be desirable at least for high end server processors. In the various reuse embodiments, only two pulse latches and a C-element may be used to realize both soft error protection as well as the hold scan functions. The significance of this reuse design approach is that it may mitigate the SER locally so that no special recovery mechanisms are needed; hence, system availability may improve. The power and area overhead could also be potentially low since existing on-chip resources are being reused.

Figure 22:
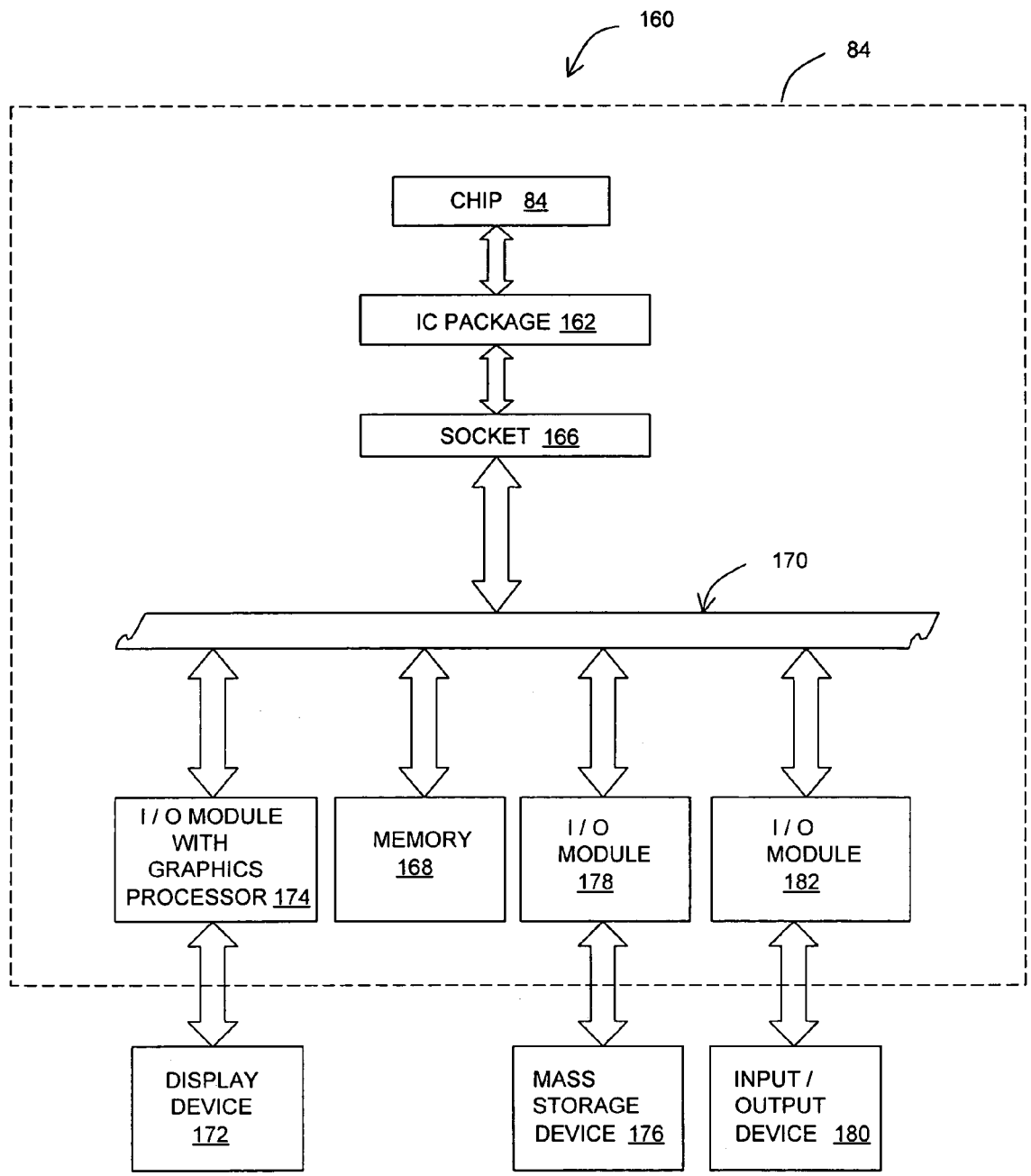
FIG. 22 is a system incorporating the latch hardening cells and/or hardening/scan cells, according to the various embodiments of the present invention.

Referring to FIG. 22, there is illustrated a system 160, which is one of many possible systems in which an IC package 162 may be used, which includes the IC chip 84 of FIGS. 7 and 8, according to one embodiment of the present invention. However, the various embodiments of the present invention are applicable to systems other than computer systems, and the computer system 160 is merely illustrative of one application. The IC chip 84 may include the latch hardening cells 20 and/or hardening/scan cells 80, which may take many different forms, as described above. In the system 160, the IC package 162 is mounted on a substrate or printed circuit board (PCB) 164 via a socket 166. The IC chip 84 of the IC package 162 may be a processor and the PCB 164 may be a motherboard. In addition to the socket 166 and the IC package 162, the PCB 164 may have mounted thereon a main memory 168 and a plurality of input/output (I/O) modules for external devices or external buses, all coupled to each other by a bus system 170 on the PCB 164. More specifically, the system 160 may include a display device 172 coupled to the bus system 170 by way of an I/O module 174, with the I/O module 174 having a graphical processor and a memory. The I/O module 174 may be mounted on the PCB 164 or may be mounted on a separate expansion board. The system 160 may further include a mass storage device 176 coupled to the bus system 170 via an I/O module 178. Another I/O device 180 may be coupled to the bus system 170 via an I/O module 182. Additional I/O modules may be included for other external or peripheral devices or external buses.

Examples of the main memory 168 include, but are not limited to, static random access memory (SRAM) and dynamic random access memory (DRAM). Examples of the mass storage device 176 include, but are not limited to, a hard disk drive, a compact disk drive (CD), a digital versatile disk driver (DVD), a floppy diskette, a tape system and so forth. Examples of the input/output devices 180 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 164. Examples of the bus system 170 include, but are not limited to, a peripheral control interface (PCI) bus, and Industry Standard Architecture (ISA) bus, and so forth. The bus system 170 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 170. Depending upon the external device, external interfaces of the I/O modules may provide to the external device(s) a point-to point parallel interface (e.g., Small Computer System Interface-SCSI) or point-to-point serial interface (e.g., EIA-232) or a multipoint serial interface (e.g., FireWire). Examples of the IC chip 84 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   a system pulse latch to generate at least one system latch signal in response to a data input signal and a pulsed system clock signal;
   a scan circuit including a shadow pulse latch, coupled to the system pulse latch, to generate at least one shadow latch signal in response to the data input signal and the pulsed system clock signal during a functional mode of operation and to generate a scan-out signal in response to a scan-in signal and at least one scan clock signal during a test mode operation;
   an output joining circuit, coupled to the system pulse latch and the shadow pulse latch, to provide a data output signal in response to the at least one system latch signal and the at least one shadow latch signal; and
   the output joining circuit being adapted to disable the at least one shadow latch signal as an input to the output joining circuit during the test mode of operation.

2. The apparatus according to claim 1, further comprising:
   a system clock source to generate the pulsed system clock signal;
   a data source to provide the data input signal; and
   wherein the system pulse latch includes a system data input terminal and a system clock input terminal; the shadow pulse latch includes a shadow data input terminal and a shadow clock input terminal; the system and the shadow data input terminals are commonly coupled to the data source to receive the data input signal; and the system and the shadow clock input terminals are commonly coupled to the system clock source to receive the pulsed system clock signal.

3. The apparatus according to claim 1, wherein
   the at least one system latch signal includes a non-inverted system latch signal and an inverted system latch signal; and
   the at least one shadow latch signal includes a non-inverted shadow latch signal and an inverted shadow latch signal.

4. The apparatus according to claim 1, wherein the output joining circuit is a C-element circuit; the C-element circuit includes a shadow signal enabled state wherein the output joining circuit is configured to be responsive both to the system latch signal and the shadow latch signal during a functional mode of operation and a shadow signal disabled state wherein the C-element is configured to be responsive only to the system latch signal during the test mode of operation; and the output joining circuit is adapted to select one of the shadow signal enable state and the shadow signal disabled state in response to a shift signal.

5. The apparatus according to claim 1, wherein
   the output joining circuit is a C-element circuit;
   the system pulse latch includes at least one system output terminal on which the system latch signal is provided;
   the shadow pulse latch includes at least one shadow output terminal on which the shadow latch signal is provided;
   the C-element circuit includes at least one system transistor having a system gate coupled to the system output terminal and at least one shadow transistor having a shadow gate coupled to the shadow output terminal; and
   the C-element circuit further includes at least one disabling transistor in parallel with the at least one shadow transistor and responsive to a shift signal to turn on during the test mode of operation and to turn off during the functional mode of operation.

6. The apparatus according to claim 5, wherein
   the at least one system output terminal includes a first and a second system output terminal to provide the system latch signal and an inverted system latch signal, respectively, to the C-element circuit;
   the at least one shadow output terminal includes a first and a second shadow output terminal to provide the shadow latch signal and an inverted shadow latch signal, respectively, to the C-element circuit;

the C-element includes a first and a second transistor coupled in series and having a first and a second gate, respectively, coupled to the first system output terminal and the first shadow output terminal, respectively;

the C-element further includes a third and a fourth transistor coupled in series and having a third and a fourth gate, respectively, coupled to the second system output terminal and the second shadow output terminal, respectively; and the at least one disabling transistor in parallel with the at least one shadow transistor includes a first and a second disabling transistor coupled in parallel to the second and the fourth transistors, respectively, with the first and the second disabling transistors having a first disabling and a second disabling gate, respectively, coupled to the shift signal.

7. The apparatus according to claim 6, wherein the C-element further includes an output node on which the data output signal is provided; the apparatus further comprising:

a keeper circuit coupled between a first node and a second node; and wherein the series-coupled first and second transistors are coupled between the first node and a ground; and the series-coupled third and fourth transistors are coupled between the second node and the ground.

8. The apparatus according to claim 5, further comprising:

a multiplexer including an input terminal to receive a master pulsed clock signal; a first output terminal to provide the pulsed system clock signal; and a second output terminal to provide the scan clock signal, with the first and the second output terminals being selectable in response to the shift signal.

9. The apparatus according to claim 1, wherein the output joining circuit is a C-element circuit;

the system pulse latch includes a system output terminal on which the system latch signal is provided;

the shadow pulse latch includes a shadow output terminal on which the shadow latch signal is provided;

the C-element circuit includes an output node on which the data output signal is provided;

the C-element circuit further includes a first leg coupled between a supply voltage and the output node and a second leg coupled between the output node and a ground;

the first leg includes a first and a second P-channel transistor coupled in series with a gate of the first P-channel transistor being coupled to the shadow output terminal and a gate of the second P-channel transistor being coupled to the system output terminal; and the second leg includes a first and a second N-channel transistor coupled in series with a gate of the first N-channel transistor being coupled to the system output terminal and a gate of the second N-channel transistor being coupled to the shadow output terminal.

10. The apparatus according to claim 9, wherein:

a keeper circuit coupled to the output node of the C-element circuit.

11. The apparatus according to claim 1, wherein during the test mode of operation:

the scan circuit is adapted to shift the scan-in signal into the shadow pulse latch in response to the scan clock signal;

the scan circuit further includes an enable circuit responsive to an update signal to provide the scan-in signal to the output joining circuit; and the shadow pulse latch is further adapted to latch a system response received from a data source in response to the pulsed system clock signal.

12. The apparatus according to claim 1, wherein the system and the shadow pulse latches include a system and a shadow storage element, respectively;

the at least one scan clock signal includes a first and a second scan clock signal;

the scan circuit includes a first enable circuit, coupled to the shadow storage element, to store the scan-in signal in the shadow storage element in response to the first scan clock signal; and the scan circuit further includes a second enable circuit, coupled to the system storage element and the shadow storage element, to move the scan-in signal from the shadow storage element to the system storage element in response to the second scan clock signal.

13. The apparatus according to claim 12, wherein the first and the second enable circuits include a first and a second tri-state inverter, respectively.

14. The apparatus according to claim 1, further comprising:

a de-racer circuit coupled an input terminal of the shadow pulse latch and having a pair of input terminals to receive the scan-in signal and the at least one scan clock signal.

15. The apparatus according to claim 1, wherein the output joining circuit is a C-element circuit;

the system pulse latch includes at least one system output terminal on which the system latch signal is provided;

the shadow pulse latch includes at least one shadow output terminal on which the shadow latch signal is provided;

the C-element circuit includes at least one system transistor having a system gate coupled to the system output terminal and at least one shadow transistor having a shadow gate coupled to the shadow output terminal; and the C-element circuit further includes at least one disabling transistor in parallel with the at least one shadow transistor and responsive to a shift signal to turn on and to turn off.

16. A method, comprising:

generating at least one system latch signal with a system pulse latch in response to a data input signal and a pulsed system clock signal during a functional mode of operation;

generating at least one shadow latch signal with a shadow pulse latch in response the data input signal and the pulsed system clock signal; and joining together the at least one system latch signal and the at least one shadow latch signal with an output joining circuit to generate a data output; and shifting in a test pattern into the shadow pulse latch during a test mode of operation using at least one scan clock signal;

disabling the at least one shadow latch signal as an input to the output joining circuit during the shifting in of the test pattern.

17. The method according to claim 16, wherein the generating of the at least one system latch signal with the system pulse latch includes generating a non-inverted system latch signal and an inverted system latch signal in response to the data input signal and the pulsed system clock signal; and generating at least a shadow latch signal with the shadow pulse latch includes generating a non-inverted shadow latch signal and an inverted shadow latch signal in response to the data input signal and the pulsed system clock signal.

18. The method according to claim 16, wherein the joining together of the at least one system latch signal and the at least one shadow latch signal with an output joining circuit includes joining together the at least one system latch signal and the at least one shadow latch signal with a C-element circuit to generate the data output signal.

19. The method according to claim 16, further comprising:
capturing a system response to the test pattern with the system pulse latch using the pulsed system clock signal;
shifting out of the shadow pulse latch the system response using the at least one scan clock signal; and
disabling the at least one shadow latch signal as an input to the output joining circuit during the shifting out of the system response.

20. The method according to claim 16, further comprising:
the disabling of the at least one shadow latch signal as an input to the output joining circuit during the shifting out of the system response in response to a shift signal;
generating the pulsed system clock signal and the at least one scan clock signal from a master pulsed clock signal; and
selecting between the pulsed system clock signal and the at least one scan clock signal in response to the shift signal.

21. The method according to claim 16, further comprising:
storing a test pattern data in a shadow storage element of the shadow pulse latch in response to a first scan clock signal; and
storing the test pattern data obtained from the shadow storage element in a system storage element of the system pulse latch in response to a second scan clock signal.

22. The method according to claim 16, further comprising:
receiving the data input signal through a first data input terminal of the system pulse latch; and
receiving the data input signal through a second data input terminal of the shadow pulse latch.

23. A system, comprising:
an integrated circuit chip including a plurality of hardening/scan cells; and a system clock source to generate a pulsed system clock signal, with at least one of the hardening/scan cells including
a system pulse latch to generate a system latch signal in response to a data input signal and the pulsed system clock signal;
a scan circuit including a shadow pulse latch to generate a shadow latch signal in response the data input signal and the pulsed system clock signal during a functional mode of operation and to generate a scan-out signal in response to a scan-in signal and at least one scan clock signal during a test mode of operation;
an output joining circuit coupled to the system and the shadow pulse latches to generate a data output signal in response to the system and the shadow latch signals;
the output joining circuit being adapted to disable the shadow latch signal as an input to the output joining circuit during the test mode of operation;
a mass storage device; and
a bus coupled to the integrated circuit chip and the mass storage device.

24. The system according to claim 23, further comprising:
automatic test equipment, coupled to the integrated circuit chip, to generate the scan-in signal and the at least one scan clock signal.

* * * * *

UNITED STATES PATENT AND TRADEMARK OFFICE
CERTIFICATE OF CORRECTION

PATENT NO. : 7,373,572 B2  
APPLICATION NO. : 11/128692  
DATED : May 13, 2008  
INVENTOR(S) : Tak M. Mak et al.

It is certified that error appears in the above-identified patent and that said Letters Patent is hereby corrected as shown below:

Col. 18, line 23 "...coupled an..." should read --...coupled to an...--;

Col. 18, line 49, "...in response the..." should read --...in response to the...--;

Col. 18, line 53, "...a data output; and..." should read --...a data output signal; and...--;

Col. 20, line 18, "...in response the..." should read --...in response to the...--.

Signed and Sealed this

Thirtieth Day of June, 2009

JOHN DOLL  
*Acting Director of the United States Patent and Trademark Office*